United States Patent
Kim et al.

(10) Patent No.: US 11,949,436 B2
(45) Date of Patent: Apr. 2, 2024

(54) LOW-DENSITY PARITY-CHECK CODING SCHEME WITH VARYING PUNCTURING PATTERN

(71) Applicant: QUALCOMM INCORPORATED, San Diego, CA (US)

(72) Inventors: Hobin Kim, San Diego, CA (US); Hari Sankar, San Diego, CA (US); Jing Jiang, San Diego, CA (US); Wei Yang, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/887,162

(22) Filed: Aug. 12, 2022

(65) Prior Publication Data
US 2024/0056103 A1 Feb. 15, 2024

(51) Int. Cl.
*H03M 13/00* (2006.01)
*H03M 13/01* (2006.01)
*H03M 13/11* (2006.01)
*H03M 13/29* (2006.01)

(52) U.S. Cl.
CPC ...... *H03M 13/6362* (2013.01); *H03M 13/015* (2013.01); *H03M 13/1108* (2013.01); *H03M 13/2948* (2013.01)

(58) Field of Classification Search
CPC .............................................. H03M 13/6362
See application file for complete search history.

(56) References Cited

U.S. PATENT DOCUMENTS

| | | | | |
|---|---|---|---|---|
| 5,937,016 A | * | 8/1999 | Choi | H04L 1/0054 375/341 |
| 6,272,183 B1 | | 8/2001 | Berens et al. | |
| 7,093,178 B2 | * | 8/2006 | Kim | H04L 1/0068 714/748 |
| 2002/0051501 A1 | * | 5/2002 | Demjanenko | H04L 1/0042 375/340 |
| 2003/0072286 A1 | * | 4/2003 | Kim | H04L 1/1819 370/335 |

(Continued)

OTHER PUBLICATIONS

Richardson, T., et al., "Design of Low-Density Parity Check Codes for 5G New Radio", IEEE Communications Magazine, Key Technologies for 5G New Radio, vol. 56, No. 3, Mar. 1, 2018, XP055480192, pp. 28-34.

(Continued)

*Primary Examiner* — Joseph D Torres
(74) *Attorney, Agent, or Firm* — Holland & Hart LLP

(57) ABSTRACT

Disclosed is a method of wireless communication. The method is performed at a first wireless node. The method comprises: obtaining a sequence of bits to be encoded, selecting a puncturing pattern from a plurality of puncturing patterns, generating, based on the sequence of bits to be encoded, a sequence of parity bits in accordance with a binary linear block coding scheme, puncturing, based on the selected puncturing pattern, at least one of the sequence of bits to be encoded or the sequence of parity bits, generating a plurality of modulation symbols based on remaining bits in the sequence of bits to be encoded and based on remaining bits in the sequence of parity bits, and transmitting, to a second wireless node, the plurality of modulation symbols.

26 Claims, 9 Drawing Sheets

(56) References Cited

U.S. PATENT DOCUMENTS

| | | | |
|---|---|---|---|
| 2003/0072292 A1* | 4/2003 | Yoon | H04B 7/264 370/441 |
| 2003/0088822 A1* | 5/2003 | Kim | H04L 1/1867 714/790 |
| 2007/0089025 A1* | 4/2007 | Hong | H03M 13/6393 714/758 |
| 2007/0162815 A1 | 7/2007 | El-Khamy et al. | |
| 2009/0217130 A1* | 8/2009 | Myung | H03M 13/255 714/752 |
| 2011/0126072 A1* | 5/2011 | Yoshimoto | H04L 1/0069 714/751 |
| 2011/0197105 A1* | 8/2011 | Murakami | H03M 13/15 714/752 |
| 2012/0093251 A1* | 4/2012 | Nakamura | H04B 7/022 375/267 |
| 2013/0223485 A1* | 8/2013 | Bai | H04L 1/1819 375/219 |
| 2018/0019862 A1* | 1/2018 | Kliewer | H04L 1/0047 |
| 2020/0052819 A1* | 2/2020 | Xu | H03M 13/13 |
| 2022/0224448 A1 | 7/2022 | Krishna Kumar et al. | |

OTHER PUBLICATIONS

Huawei, et al., "LDPC Coded Bits Interleaving and Mapping to Modulation Symbols for HARQ Retransmissions", 3GPP TSG RAN WG 1 Meeting #91, R1-1721391, 3rd Generation Partnership Project, Mobile Competence Centre, 650, Route Des Lucioles, F-06921 Sophia-Antipolis Cedex, France, vol. RAN WG1, No. Reno, USA, Nov. 27, 2017-Dec. 1, 2017, Nov. 27, 2017, XP051363832, 9 pages.

Huawei, et al., "LDPC Design for eMBB Data", 3GPP TSG RAN WG1 Meeting #88, R1-1701706, 3rd Generation Partnership Project, Mobile Competence Centre, 650, Route Des Lucioles, F-06921 Sophia-Antipolis Cedex, France, vol. RAN WG1, No. Athens, Greece, Feb. 13, 2017-Feb. 17, 2017, Feb. 7, 2017, XP051220850, 7 pages.

Partial International Search Report—PCT/US2023/029073—ISA/EPO—dated Oct. 4, 2023.

International Search Report and Written Opinion—PCT/US2023/029073—ISA/EPO—dated Nov. 28, 2023.

* cited by examiner $$H = \begin{bmatrix} 1 & 1 & 1 & 0 & 0 \\ 1 & 0 & 0 & 1 & 1 \\ 1 & 1 & 0 & 0 & 1 \\ 0 & 1 & 1 & 1 & 0 \end{bmatrix} \quad x = \begin{bmatrix} x_0 \\ x_1 \\ x_2 \\ x_3 \\ x_4 \end{bmatrix}$$

LOW-DENSITY PARITY-CHECK CODING SCHEME WITH VARYING PUNCTURING PATTERN

INTRODUCTION

Aspects of the present disclosure generally relate to wireless communications, and more particularly to techniques and apparatuses for encoding and decoding.

Wireless communication systems are widely deployed to provide various telecommunication services such as telephony, video, data, messaging, and broadcasting. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems.

A wireless communication network may include a number of base stations (BSs) that can support communication for a number of user equipments (UEs). A user equipment (UE) may communicate with a base station (BS) via downlink and uplink. The downlink (or forward link) refers to a communication link from the BS to the UE, and the uplink (or reverse link) refers to a communication link from the UE to the BS. As will be described in more detail herein, a BS may also be referred to as a Node B, a gNB, an access point (AP), a radio head, a transmit receive point (TRP), a New Radio (NR) BS, a 5G Node B, and/or the like.

The above multiple access technologies have been adopted in various telecommunication standards to provide a common protocol that enables different user equipment to communicate on a municipal, national, regional, and even global level. LTE/LTE-Advanced is a set of enhancements to the Universal Mobile Telecommunications System (UMTS) mobile standard promulgated by the Third Generation Partnership Project (3GPP). New Radio (NR), which may also be referred to as 5G, is a set of enhancements to the LTE mobile standard promulgated by the Third Generation Partnership Project (3GPP). NR is designed to by better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation.

However, as the demand for mobile broadband access continues to increase, there exists a need for further improvements in wireless communications. Preferably, these improvements should be applicable to LTE and/or NR, and/or also to other multiple access technologies and the telecommunication standards that employ these technologies.

SUMMARY

In some aspects of the present disclosure, a method for wireless communication is disclosed, the method being performed at a first wireless node, the method may include obtaining a sequence of bits to be encoded, selecting a puncturing pattern from a plurality of puncturing patterns, generating, based on the sequence of bits to be encoded, a sequence of parity bits in accordance with a binary linear block coding scheme, puncturing, based on the selected puncturing pattern, at least one of the sequence of bits to be encoded or the sequence of parity bits, generating a plurality of modulation symbols based on remaining bits in the sequence of bits to be encoded and based on remaining bits in the sequence of parity bits, and transmitting, to a second wireless node, the plurality of modulation symbols.

In some aspects of the present disclosure, another method for wireless communication is disclosed, the method being performed at a second wireless node, the method may include receiving, from a first node, a plurality of modulation symbols corresponding to a sequence of bits to be decoded, selecting a puncturing pattern from a plurality of puncturing patterns, generating a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols, generating, based on the sequence of metrics, a sequence of decoded bits in accordance with a binary linear block coding scheme, and outputting the sequence of decoded bits for further processing.

In some aspects of the present disclosure, an apparatus for wireless communication is disclosed, the apparatus may comprise a memory and one or more processors coupled to the memory, the memory and the one or more processors being configured to obtain a sequence of bits to be encoded, select a puncturing pattern from a plurality of puncturing patterns, generate, based on the sequence of bits to be encoded, a sequence of parity bits in accordance with a binary linear block coding scheme, puncture, based on the selected puncturing pattern, at least one of the sequence of bits to be encoded or the sequence of parity bits, generate a plurality of modulation symbols based on remaining bits in the sequence of bits to be encoded and based on remaining bits in the sequence of parity bits, and transmit, to a second wireless node, the plurality of modulation symbols.

In some aspects of the present disclosure, another apparatus for wireless communication is disclosed, the apparatus may comprise a memory and one or more processors coupled to the memory, the memory and the one or more processors being configured to receive, from a first node, a plurality of modulation symbols corresponding to a sequence of bits to be decoded, select a puncturing pattern from a plurality of puncturing patterns, generate a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols, generate, based on the sequence of metrics, a sequence of decoded bits in accordance with a binary linear block coding scheme, and output the sequence of decoded bits for further processing.

In some aspects of the present disclosure, an apparatus for wireless communication (e.g., the apparatus configured for use at a first wireless node) is disclosed, the apparatus may comprise means for obtaining a sequence of bits to be encoded, means for selecting a puncturing pattern from a plurality of puncturing patterns, means for generating, based on the sequence of bits to be encoded, a sequence of parity bits in accordance with a binary linear block coding scheme, means for puncturing, based on the selected puncturing pattern, at least one of the sequence of bits to be encoded or the sequence of parity bits, means for generating a plurality of modulation symbols based on remaining bits in the sequence of bits to be encoded and based on remaining bits in the sequence of parity bits, and means for transmitting, to a second wireless node, the plurality of modulation symbols.

In some aspects of the present disclosure, another apparatus for wireless communication (e.g., the apparatus configured for use at a second wireless node) is disclosed, the apparatus may comprise means for receiving, from a first node, a plurality of modulation symbols corresponding to a sequence of bits to be decoded, means for selecting a puncturing pattern from a plurality of puncturing patterns, means for generating a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols, means for generating, based on the sequence of metrics, a sequence of decoded bits in accordance with a binary linear block coding scheme, and means for outputting the sequence of decoded bits for further processing.

In some aspects of the present disclosure a non-transitory computer-readable medium storing one or more instructions for wireless communication is disclosed. The one or more instructions, when executed by one or more processors, may cause the one or more processors to obtain a sequence of bits to be encoded, select a puncturing pattern from a plurality of puncturing patterns, generate, based on the sequence of bits to be encoded, a sequence of parity bits in accordance with a binary linear block coding scheme, puncture, based on the selected puncturing pattern, at least one of the sequence of bits to be encoded or the sequence of parity bits, generate a plurality of modulation symbols based on remaining bits in the sequence of bits to be encoded and based on remaining bits in the sequence of parity bits, and transmit, to a second wireless node, the plurality of modulation symbols.

In some aspects of the present disclosure a non-transitory computer-readable medium storing one or more instructions for wireless communication is disclosed. The one or more instructions, when executed by one or more processors, may cause the one or more processors to receive, from a first node, a plurality of modulation symbols corresponding to a sequence of bits to be decoded, select a puncturing pattern from a plurality of puncturing patterns, generate a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols, generate, based on the sequence of metrics, a sequence of decoded bits in accordance with a binary linear block coding scheme, and output the sequence of decoded bits for further processing.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the present disclosure are described in more detail hereinafter with reference to the accompanying drawings. This disclosure may, however, be implemented in many different forms and should not be construed as limited to any specific structure or function presented throughout this disclosure. Rather, these aspects are provided so that this disclosure will be thorough and complete, and will fully convey the scope of the present disclosure to those skilled in the art. Based on the teachings herein one skilled in the art should appreciate that the scope of the present disclosure is intended to cover any aspect of the present disclosure disclosed herein, whether implemented independently of or combined with any other aspect of the present disclosure. For example, an apparatus may be implemented or a method may be practiced using any number of the aspects set forth herein. In addition, the scope of the present disclosure is intended to cover such an apparatus or method which is practiced using other structure, functionality, or structure and functionality in addition to or other than the various aspects of the present disclosure set forth herein. It should be understood that any aspect of the present disclosure disclosed herein may be implemented by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with 3G and/or 4G wireless technologies, aspects of the present disclosure can be applied in other generation-based communication systems, such as 5G and later, including NR technologies and Open RAN (O-RAN) technologies.

Figure 1:
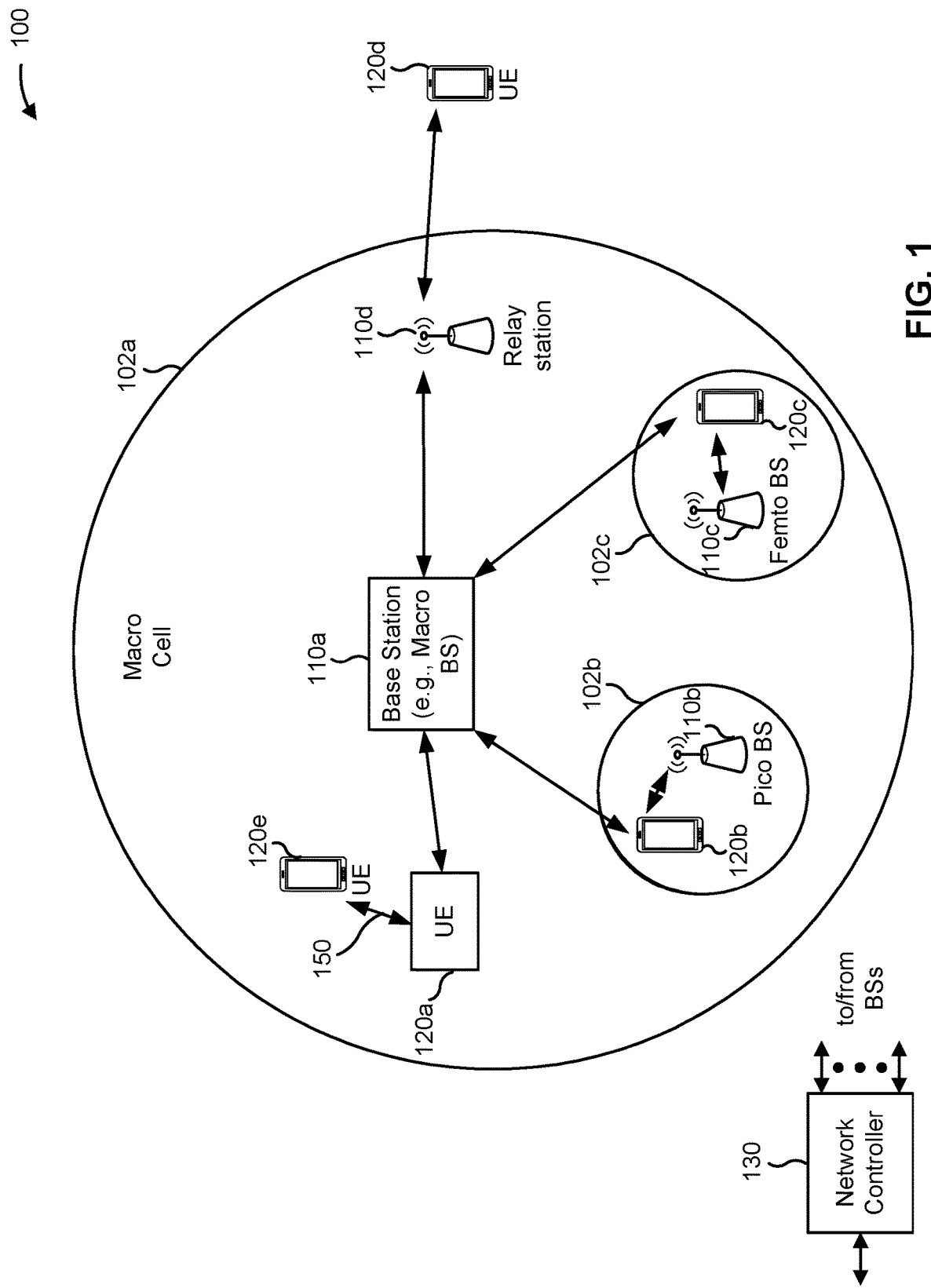
FIG. 1 is a block diagram conceptually illustrating an example of a wireless communication network, in accordance with various aspects of the present disclosure.

FIG. 1 is a diagram illustrating a wireless network 100 in which aspects of the present disclosure may be practiced. The wireless network 100 may be an LTE network, a 5G or NR network, and/or the like. Wireless network 100 may include a number of BSs 110 (shown as BS 110a, BS 110b, BS 110c, and BS 110d) and other network entities. A BS is an entity that communicates with user equipments (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impacts on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to one or more (e.g., a set of) BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c, 120d, 120e, and/or the like) may be dispersed throughout wireless network 100, and each UE may be stationary or mobile. A UE may communicate with one or more BSs in wireless network 100, may communicate directly with another UE (e.g., UE 120a and UE 120e, as illustrated in FIG. 1) via a sidelink (e.g., link 150 shown in FIG. 1 as connecting UE 120a and UE 120e), and/or the like.

In some cases, two or more subordinate entities (e.g., UEs) may communicate with each other using sidelink signals. Real-world applications of such sidelink communications may include public safety, proximity services, UE-to-network relaying, vehicle-to-everything (V2X) communications, Internet of Everything (IoE) communications, Internet-of-Things (IoT) communications, mission-critical mesh, and/or various other suitable applications. Generally, a sidelink signal may refer to a signal communicated from one subordinate entity (e.g., UE1) to another subordinate entity (e.g., UE2) without relaying that communication through a scheduling entity (e.g., UE or BS), even though the scheduling entity may be utilized for scheduling and/or control purposes. In some examples, the sidelink signals may be communicated using a licensed spectrum (unlike wireless local area networks, which may use an unlicensed spectrum).

A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered as machine-type communication (MTC) or evolved or enhanced machine-type communication (eMTC) UEs. MTC and eMTC UEs include, for example, robots, drones, remote devices, sensors, meters, monitors, location tags, and/or the like, that may communicate with a base station, another device (e.g., remote device), or some other entity.

A wireless node (e.g., UE, BS, or the like) may provide, for example, connectivity for or to a network (e.g., a wide area network such as Internet or a cellular network) via a wired or wireless communication link. Some UEs may be considered as Internet-of-Things (IoT) devices, and/or may be implemented as NB-IoT (narrowband internet of things) devices. Some UEs may be considered as a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular radio access technology (RAT) and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

As described herein, a wireless node (which may be referred to as a node, a network node, a network entity, or a wireless node) may include, be, or be included in (e.g., be a component of) a base station (e.g., any base station described herein), a UE (e.g., any UE described herein), a network controller, an apparatus, a device, a computing system, an integrated access and backhauling (IAB) node, a distributed unit (DU), a central unit (CU), a remote unit (RU), and/or another processing entity configured to perform any of the techniques described herein. For example, a network node may be a UE. As another example, a network node may be a base station or network entity. As another example, a first network node may be configured to communicate with a second network node or a third network node. In one aspect of this example, the first network node may be a UE, the second network node may be a base station, and the third network node may be a UE. In another aspect of this example, the first network node may be a UE, the second network node may be a base station, and the third network node may be a base station. In yet other aspects of this example, the first, second, and third network nodes may be different relative to these examples. Similarly, reference to a UE, base station, apparatus, device, computing system, or the like may include disclosure of the UE, base station, apparatus, device, computing system, or the like being a network node. For example, disclosure that a UE is configured to receive information from a base station also discloses that a first network node is configured to receive information from a second network node. Consistent with this disclosure, once a specific example is broadened in accordance with this disclosure (e.g., a UE is configured to receive information from a base station also discloses that a first network node is configured to receive information from a second network node), the broader example of the narrower example may be interpreted in the reverse, but in a broad, open-ended way. The example above where a UE is configured to receive information from a base station also discloses that a first network node is configured to receive information from a second network node, where the first network node may refer to a first UE, a first base station, a first apparatus, a first device, a first computing system, a first set of one or more one or more components, a first processing entity, or the like configured to receive the information; and the second network node may refer to a second UE, a second base station, a second apparatus, a second device, a second computing system, a second set of one or more components, a second processing entity, or the like.

As described herein, communication of information (e.g., any information, signal, or the like) may be described in various aspects using different terminology. Disclosure of one communication term includes disclosure of other communication terms. For example, a first network node may be described as being configured to transmit information to a second network node. In this example and consistent with this disclosure, when the first network node is configured to transmit information to the second network node, the first network node may be configured to provide, send, output, communicate, or transmit information to the second network node. Similarly, in this example and consistent with this disclosure, when the first network node is configured to transmit information to the second network node, the second network node may be configured to receive, obtain, or decode the information that is provided, sent, output, communicated, or transmitted by the first network node.

As indicated above, FIG. 1 is provided merely as an example. Other examples may differ from what is described with regard to FIG. 1.

Figure 2:
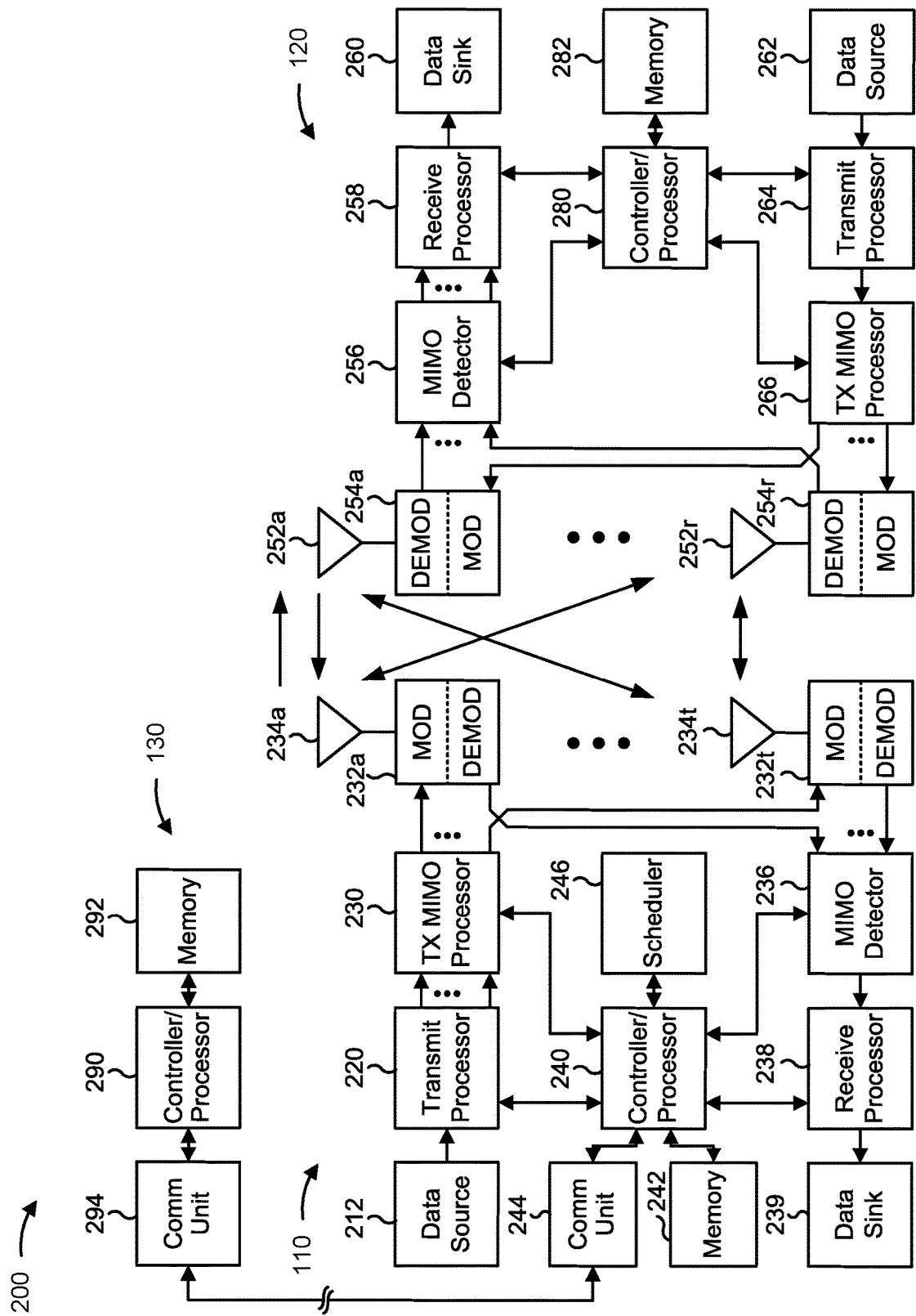
FIG. 2 is a block diagram conceptually illustrating an example of a base station in communication with a user equipment (UE) in a wireless communication network, in accordance with various aspects of the present disclosure.

FIG. 2 shows a block diagram of a design 200 of base station 110, UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based on channel quality indicators (CQIs) received from the UE, process (e.g., encode and modulate) the data for each UE based on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (Tx) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 (e.g., 232a through 232t) may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 (e.g., 254a through 254r) may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120a to a data sink 260, and provide decoded control information and system information to a controller/processor 280. A channel processor may identify reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a Tx MIMO processor 266 if applicable, further processed by modulators 254a through 254r (e.g., for DFT-s-OFDM, CP-OFDM, and/or the like), and transmitted to base station 110 on the uplink. At base station 110, the uplink signals from UE 120, and/or other UEs may be received by antennas 234 (e.g., 234a through 234t), processed by demodulators 232, detected by a MIMO detector 236 if applicable, and further processed by a receive processor 238 to obtain decoded data and control information sent by UE 120a. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Transmit processor 220 of the base station 110, receive processor 238 of the base station 110, transmit processor 264 of the UE 120, receive processor 258 of the UE 120, and/or any other component(s) of FIG. 2 may perform one or more techniques associated with encoding and/or decoding, as described in more detail elsewhere herein. For example, transmit processor 220 of the base station 110, receive processor 238 of the base station 110, transmit processor 264 of the UE 120, receive processor 258 of the UE 120, and/or any other component(s) of FIG. 2 may perform or direct operations of, for example, methods of FIG. 4, FIG. 5, FIG. 6, or FIG. 7, or processes of FIG. 8 or FIG. 9, and/or other methods and processes as described herein. Memories 242 and 282 may store data and program codes for base station 110 and UE 120, respectively. A scheduler 246 may schedule UEs for data transmission on the downlink and/or uplink.

In some aspects, a base station 110 (or a UE 120) may include means for obtaining a sequence of bits to be encoded, means for selecting a puncturing pattern from a plurality of puncturing patterns, means for generating, based on the sequence of bits to be encoded, a sequence of parity bits in accordance with a binary linear block coding scheme, means for puncturing, based on the selected puncturing pattern, at least one of the sequence of bits to be encoded or the sequence of parity bits, means for generating a plurality of modulation symbols based on remaining bits in the sequence of bits to be encoded and based on remaining bits in the sequence of parity bits, and means for transmitting, to a second wireless node, the plurality of modulation symbols.

In some aspects, a base station 110 (or a UE 120) may include means for receiving, from a first node, a plurality of modulation symbols corresponding to a sequence of bits to be decoded, means for selecting a puncturing pattern from a plurality of puncturing patterns, means for generating a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols, means for generating, based on the sequence of metrics, a sequence of decoded bits in accordance with a binary linear block coding scheme, and means for outputting the sequence of decoded bits for further processing.

As indicated above, FIG. 2 is provided merely as an example. Other examples may differ from what is described with regard to FIG. 2.

Figure 3:
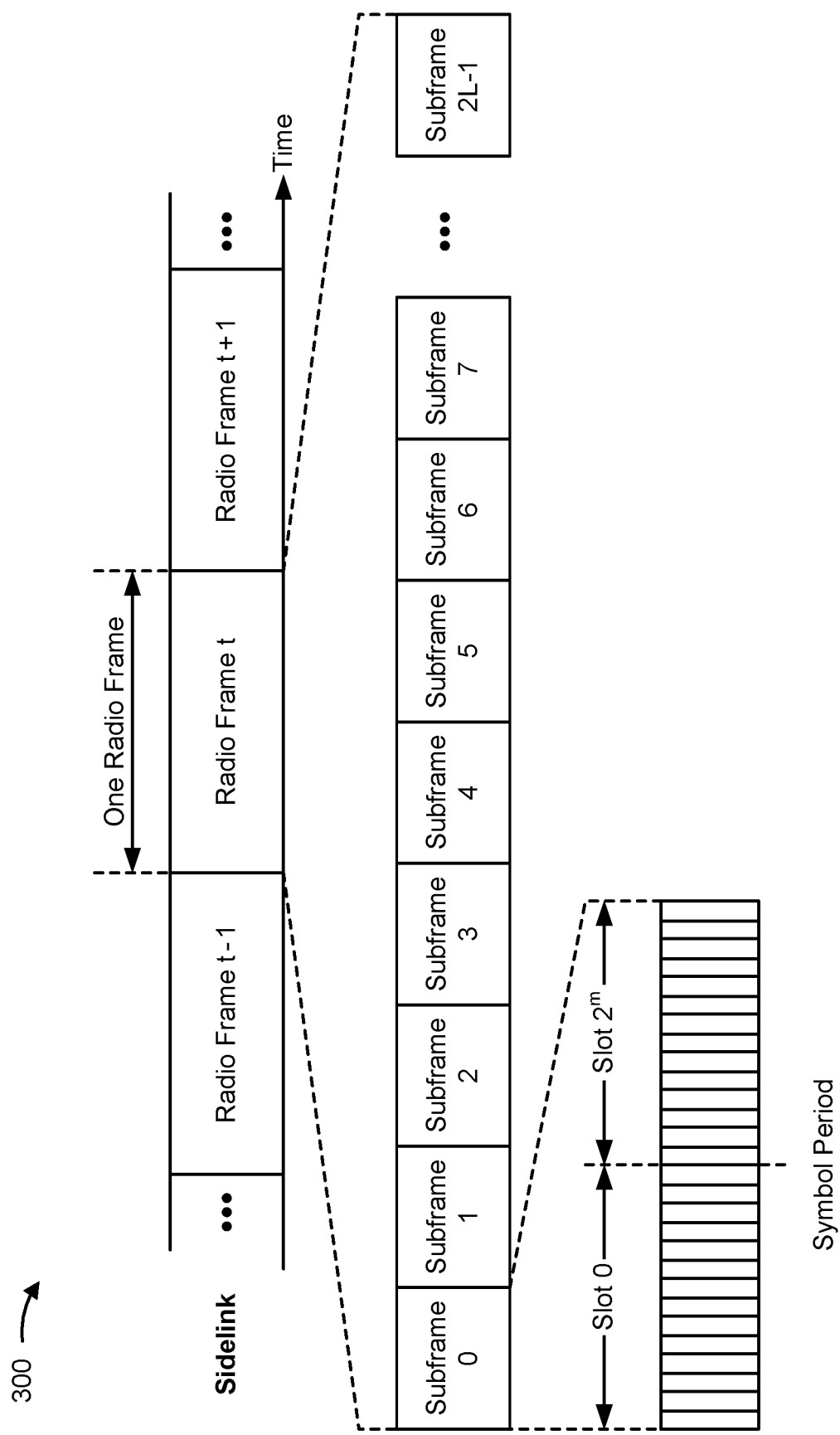
FIG. 3 is a block diagram conceptually illustrating an example of a frame structure in a wireless communication network, in accordance with various aspects of the present disclosure.

FIG. 3 shows an example frame structure 300 for frequency division duplexing (FDD) in a telecommunications system (e.g., LTE, 5G NR, and/or the like). The transmission timeline may be partitioned into units of radio frames, where t represents time. Each radio frame may have a predetermined duration (e.g., 10 milliseconds (ms)) and may be partitioned into a plurality of subframes with indices of 0 through 2L-1. Each subframe may include two slots. As an example, each radio frame may be partitioned into 10 subframes 0 through 9 and 20 slots with indices of 0 through 19. Each slot may include a plurality of symbol periods, such as seven symbol periods for a normal cyclic prefix or six symbol periods for an extended cyclic prefix.

In some aspects, a UE (e.g., UE 120a, and/or the like) may transmit, to another UE (e.g., UE 120a, and/or the like) on a sidelink, one or more sidelink communications in a transmission period, which may include one or more slots included in frame structure 300. In some aspects, the other UE may receive the one or more sidelink communications, may generate feedback for the one or more sidelink communications, may incorporate the feedback into one or more feedback communications, and may transmit, to the UE on the sidelink, the one or more feedback communications in one or more symbols and/or slots included in a reporting period, in frame structure 300, configured for the sidelink.

While some techniques are described herein in connection with frames, subframes, slots, and/or the like, these techniques may equally apply to other types of wireless communication structures, which may be referred to using terms other than "frame," "subframe," "slot," and/or the like in 5G NR. In some aspects, a wireless communication structure may refer to a periodic time-bounded communication unit defined by a wireless communication standard and/or protocol.

As indicated above, FIG. 3 is provided merely as an example. Other examples may differ from what is described with regard to FIG. 3.

In some aspects of the present disclosure, wireless nodes dispersed in the wireless network 100, such as base stations 110 and UEs 120 may use error-correcting codes to compensate for intrinsic unreliability of information transfer through a wireless medium by introducing redundancy in transmitted data.

Figure 4:
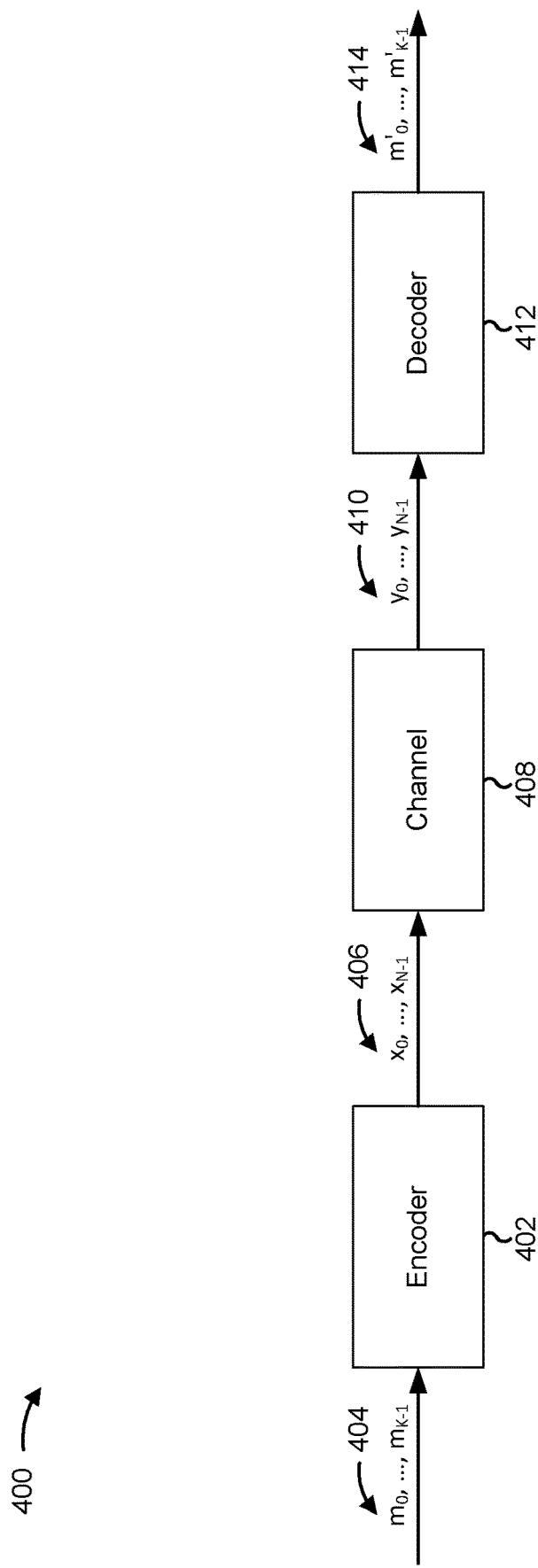
FIG. 4 shows a block diagram illustrating usage of error-correcting codes in a wireless network in accordance with various aspects of the present disclosure.

FIG. 4 shows a block diagram 400 illustrating usage of error-correcting codes in a wireless network in accordance with various aspects of the present disclosure. In some aspects, an encoder 402 may obtain a message m 404 to be encoded composed of a sequence of K bits (e.g., designated as bits $m_0$ through $m_{K-1}$). The encoder 402 may be implemented by a portion of transmit processor 220 of base station 110, or by a portion of transmit processor 264 of UE 120, or any suitable component of base station 110, UE 120, and/or the like. In some aspects, the encoder 402 may be located in a physical (PHY) layer. The message m 404 may be obtained from a higher layer, or from a suitable preceding processing stage in the PHY layer, and/or the like.

In some aspects, the encoder 402 may generate, based on the message m 404, a sequence of additional bits which are sometimes referred to as parity bits, and may output a codeword x 406 composed of a sequence of N bits (e.g., designated as bits $x_0$ through $x_{N-1}$). The encoder 402 may apply a suitable processing (e.g., encoding) to generate the parity bits in accordance with a coding scheme, such as a binary linear block coding scheme, for example, a low-density parity-check (LDPC) coding scheme (described in more detail below), and/or the like. In some aspects, the codeword x 406 may be composed of K bits of the message m 404 and N-K parity bits. The K bits of the message m 404 may be referred to as systematic bits. A ratio K/N may sometimes be referred to as a coding rate (or a code rate) and may be designated by using R.

In some aspects, bits of the codeword x 406 may further undergo, for instance, rate matching (not shown) and mapping to a plurality of modulation symbols (not shown) in accordance with a suitable rate matching and modulation scheme, respectively, and/or the like. Rate matching may effectuate selecting a subset of bits of the codeword x 406 for transmission over a wireless medium, for instance, in accordance with and based on an indication (e.g., an indication of a redundancy version, RV in LTE, NR, and/or the like) from a hybrid automatic repeat request (HARD) process. Mapping to modulation symbols may comprise generating a plurality (e.g., a block) of modulation symbols (e.g., complex-valued modulation symbols) in accordance with a modulation scheme, such as an amplitude-shift keying (ASK), a phase-shift keying (PSK), a quadrature amplitude modulation (QAM), and/or the like, based on the remaining bits in the codeword x 406 after the rate matching. The skilled person will appreciate that bits of the codeword x 406 and/or modulation symbols may, in some aspects, additionally undergo scrambling, interleaving, layer mapping, spatial processing and/or the like (not shown).

Transmitting a radio frequency (RF) signal carrying modulation symbols (which in turn correspond to the codeword x 406) may become a source of signal impairment, and thus cause signal degradation. For example, imperfections in a channel 408 may involve channel distortion, which may include linear distortion, multi-path effects, Additive White Gaussian Noise (AWGN), and/or the like. As a result, a plurality of modulation symbols and/or a corresponding sequence of bits to be decoded y 410 (e.g., bits $y_0$ through $y_{N-1}$) received from the channel 408 at a receiver may be distorted relative to respective modulation symbols and/or bits provided to the channel 408 by a transmitter.

In some aspects, a decoder 412 may receive a plurality of modulation symbols corresponding to bits to be decoded y 410 and apply a suitable processing (e.g., decoding) to generate, based on the received symbols and/or bits, a sequence of decoded bits m' 414 (e.g., $m'_0$ through $m'_{K-1}$). The processing by the decoder 412 may correspond to the processing by the encoder 402, and may, for example, invert the coding scheme applied by the encoder 402. The sequence of decoded bits m' 414 may also be referred to as a decoded message. In case of successful decoding, the decoded message m' 414 provided by the decoder 412 is equal to the message m 404 provided to the encoder 402. The decoder 412 may be implemented by a portion of receive processor 238 of base station 110, or by a portion of receive processor 258 of UE 120, or any suitable component of base station 110, UE 120, and/or the like. In some aspects, the decoder 412 may be located in a physical (PHY) layer. The decoded message m' 414 may be provided to a higher layer, or to a suitable further processing stage in the PHY layer, and/or the like.

In some aspect, the RF signal received from the channel 408 may undergo additional processing (not shown), for example, processing reversing rate matching, de-mapping bits and modulation symbols, de-scrambling, de-interleaving, reversing layer mapping, reversing spatial processing and/or the like. In addition, the decoder 412 may generate the message m' 414 based on the received RF signal and an indication (e.g., an indication of RV, and/or an indication in accordance with a soft combining scheme such as chase combining, incremental redundancy, and/or the like) from a HARQ process and in accordance with a coding scheme (e.g., LDPC).

More specifically, in some aspects, the decoder 412 may generate a sequence of metrics based on the received plurality of modulation symbols. Each metric in the sequence of metrics may correspond to a bit in the sequence of bits to be decoded y 410. In some aspects, a metric may indicate a value of a bit (e.g., a value of logical 0, or a value of logical 1) and a reliability of the value of the bit. A reliability of a value of a bit in the sequence y 410 may refer to a degree to which the value of a bit may be dependent on to be accurate (e.g., be equal to the value of the respective bit in the codeword x 406). For instance, a reliability may be low if a signal corresponding to a bit is received with a high amount of impairment (e.g., noise, distortion, interference), whereas a reliability may be high if a respective signal is received a low amount of impairment.

Still more specifically, in some aspects of the present disclosure, a metric may be defined, given a received value, as a logarithm of a ratio of a probability that a value of logical 0 has been transmitted and a probability that a value of logical 1 has been transmitted. In some aspects, such metric may be referred to as a logarithmic (log) likelihood ratio (LLR), and may be defined, given a received value $$y_i, \text{ as } LLR(x_i) = \log \frac{p(x_i = 0 | y_i)}{p(x_i = 1 | y_i)},$$

where the index i refers to an individual element of the sequence of bits x 406 (or the sequence of bits y 410). Thus, if $p(x_i=0|y_i) > p(x_i=1|y_i)$, then $LLR(x_i)$ is positive and, the greater the difference between $p(x_i=0|y_i)$ and $p(x_i=1|y_i)$, i.e., the more certainty that $x_i=0$, the larger the positive value for $LLR(x_i)$. Similarly, if $p(x_i=1|y_i) > p(x_i=0|y_i)$, then $LLR(x_i)$ is negative and, the greater the difference between $p(x_i=0|y_i)$ and $p(x_i=1|y_i)$, i.e., the more certainty that $x_i=1$, the larger the negative value for $LLR(x_i)$. In some aspects, a sign of $LLR(x_i)$ may provide a value of a bit (e.g., a value of logical 0, or a value of logical 1); a magnitude $|LLR(x_i)|$ may provide a reliability of the value of this bit.

As indicated above, FIG. 4 is provided merely as an example. Other examples may differ from what is described with regard to FIG. 4.

Low density parity-check (LDPC) codes are a particular type of binary linear block error correcting codes which typically use an iterative coding (e.g., encoding and/or decoding) scheme. LDPC codes may be represented by bipartite graphs (often referred to as "Tanner graphs"), wherein a set of variable nodes corresponds to bits of a codeword, and a set of check nodes corresponds to a set of parity-check constraints that define the code. In some aspects, a variable node and a check node are considered "neighbors" if they are connected by an edge in the graph. A bit sequence (e.g., a codeword x 406 or a sequence of bits to be decoded y 410) may have a one-to-one association with the variable node sequence (e.g., variable nodes 520, see FIG. 5A below). Such a bit sequence may be a valid codeword if and only if, for each check node, the bits associated with all neighboring variable nodes sum to zero modulo two (i.e., they include an even number of logical 1's).

Figures 5A, 5B:
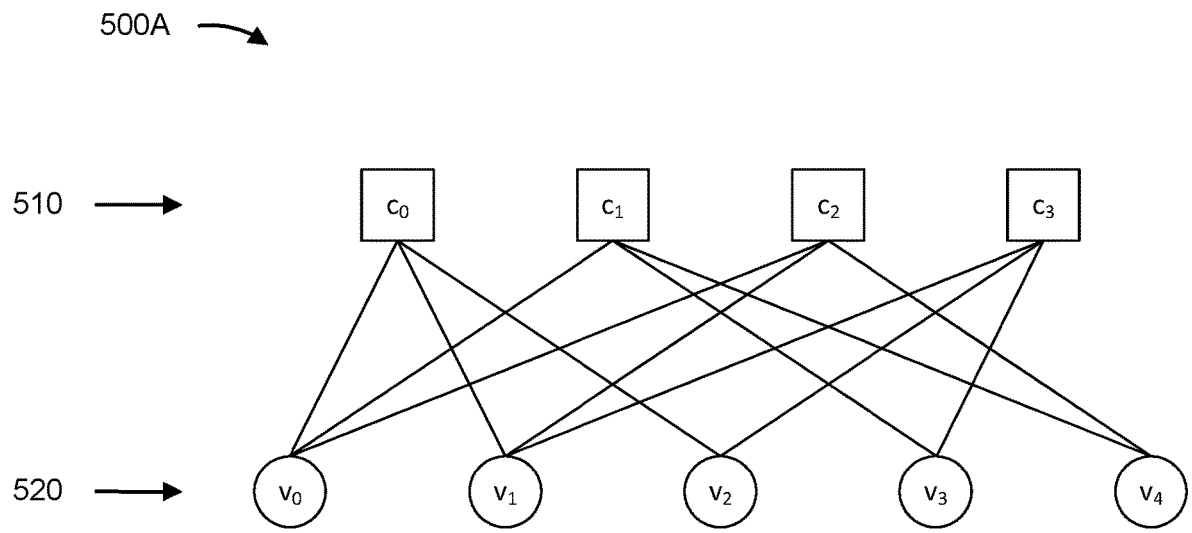
FIG. 5A shows a bipartite graph representing an exemplary LDPC code, in accordance with various aspects of the present disclosure.
FIG. 5B shows a matrix representation of the bipartite graph 500A of FIG. 5A, in accordance with various aspects of the present disclosure.

FIG. 5A shows a bipartite graph 500A representing an exemplary LDPC code, in accordance with various aspects of the present disclosure. The exemplary bipartite graph 500A includes a set of 4 check nodes 510 (represented by squares) connected to a set of 5 variable nodes 520 (represented by circles). Edges in the graph 510A connect the check nodes 510 and the variable nodes 520. FIG. 5B shows a matrix representation 500B of the bipartite graph 500A of FIG. 5A, in accordance with various aspects of the present disclosure. The matrix representation 500B includes a parity-check matrix H 530 and a codeword vector x 540 (e.g., codeword x 406), where $x_0, \ldots, x_4$ represent bits of the codeword vector x 540. More specifically, the codeword vector x 540 may represent a valid codeword if and only if $Hx=0$. For example, in some aspects of the present disclosure, the codeword x 540 may correspond to the codeword x 406 and may be composed of K bits of the message m 404 and N−K parity bits determined to fulfill the condition $Hx=0$.

A received LDPC codeword (e.g., a sequence of bits to be decoded y 410) and/or a sequence of modulation symbols corresponding thereto, may be decoded to produce a reconstructed version of the original codeword (e.g., a codeword x 406) and/or an original data unit that was encoded (e.g., a sequence of decoded bits m' 414). An LDPC decoder (e.g., decoder 412) may operate by exchanging messages (not shown) within the bipartite graph 500A, along the edges, and updating these messages by performing computations at the nodes (i.e., at check nodes 510 and at variable nodes 520) based on respective incoming messages.

For example, in some aspects of the present disclosure, each variable node 520 in the graph 500A may initially be provided with a metric that indicates a value of a respective bit and a reliability of the value of the bit. In some aspects, the metric may be referred to as a "soft bit". The initial metric may be determined by observations of the communications channel (e.g., channel 408), for example, with regard to distortions described above. Using these metrics, in some aspect, the LDPC decoder may update messages by iteratively reading them, or some portion thereof, from memory and writing an updated message, or some portion thereof, back to memory. The update operations may be based on the parity-check constraints of the corresponding LDPC code (e.g., variable nodes 510, check nodes 520, and/or matrix H 530).

In some aspects of the present disclosure, the code represented by bipartite graph 500A and/or the matrix H 530 may undergo "lifting" prior to be used in encoding/decoding. A graph representation of a lifted code may be obtained by attaching multiple copies of the graph 500A (which may, in particular, in case of lifting, be called a "protograph" or a "base graph") and by then permuting edges across such copies. The number of attached copies may be referred to as a lifting size and may be typically represented by a variable Z. A matrix representation of a lifted code may be obtained by replacing each zero-valued entry in the matrix H 530 with a Z×Z all-zero matrix and each non-zero-valued entry with a Z×Z permutation matrix. In some aspects of the present disclosure, the permutation matrix may be a circularly shifted (i.e., cyclic shifted, or circulant) Z×Z identity matrix. A distance of the shift (e.g., a number of columns by which the identity matrix Z×Z is circularly shifted) may be determined individually for each non-zero-valued entry in the matrix H 530. As a result, the obtained codeword may have a length of N·Z bits, message m 404 and m' 414 may have a length of K·Z bits.

In addition, in some aspects of the present disclosure, one or more bits of a codeword (e.g., codeword x 406, codeword x 540) generated by the LDPC encoder (e.g., encoder 402) may be punctured. Puncturing may refer to not transmitting respective one or more bits of the generated codeword. Puncturing may be regarded as a performance improving measure since less bits (e.g., less than N bits, or less than N·Z bits in case of lifting) are transmitted over the channel instead of N bits or N·Z bits, respectively. The LDPC decoder (e.g., decoder 412) may handle the one or more punctured bits as erased and may perform decoding as for the original code (e.g., with N bits or N·Z bits, respectively). In other words, structural and hardware configuration of the decoder is independent of the puncturing. The original code may sometimes be referred to as mother code. In some aspects of the present disclosure, the LDPC decoder may assume a lowest initial reliability for the one or more punctured bits, for example, $LLR(x_i)=0$, where $x_i$ may denote the one or more punctured bits. The skilled person will appreciate that puncturing is not limited to LDPC and may be applied, for example, to any binary linear block coding scheme.

In some aspects, the base graph may be relatively small and may capture macroscopic properties of the code (e.g., threshold). For example, LDPC in NR may use N=66 for base graph 1 (BG1) and N=50 for base graph 2 (BG2). Lifting may enable a larger length of the obtained codeword (e.g., in NR, $Z=A \cdot 2^j$ for A={2, 3, 5, 7, 9, 11, 13, 15} and j=0, 1, 2, 3, 4, 5 excluding values exceeding $Z_{max}=384$). In some aspects, LDPC in NR may comprise a base graph with a high-rate core with a double-diagonal deg-2 chain and a Raptor-code like deg-1 extension (low-density generator matrix, LDGM) for rate compatibility and HARQ. In addition, LDPC in NR may employ two punctured variable nodes corresponding to systematic bits which may improve (asymptotic) threshold, e.g., at a large number of decoding iterations. More specifically, bits corresponding to the first and second column in the matrix representation (e.g., bits $c_0$ through $c_{2Z-1}$ out of $c_0$ through $c_{K-1}$ input bits) may be punctured (e.g., not be transmitted). Instead, given a particular resource, more parity nodes (or bits) may be transmitted. LDPC in NR may be used for transmitting a physical data channel, for example, a Physical Downlink Shared Channel (PDSCH), a Physical Uplink Shared Channel (PUSCH), and/or the like. In some aspects, LDPC in NR may operate in accordance with one or more Technical Specifications (TS) produced by a third Generation Partnership Project (3GPP), for example, 3GPP 38.212, clause 5.3.2, and/or the like.

As indicated above, FIGS. 5A and 5B are provided merely as an example. Other examples may differ from what is described with regard to FIGS. 5A and 5B.

In some aspects of the present disclosure, a varying puncturing pattern (e.g., a puncturing pattern selected from a plurality of puncturing patterns) may be employed. For example, emerging wireless standards (e.g., 6G and/or the like) may have requirements for channel coding which may differ from requirements for existing wireless standards (e.g., NR/5G and/or the like). More specifically, in such emerging wireless standards, for example, throughput may be higher relative to existing standards. In addition, less power for decoding may be available and/or preferred. Likewise, a lower number of decoding iterations may be available and/or preferred. Furthermore, certain receiver types may achieve advantageous performance given the requirements for emerging wireless standards, contrary to their performance given the requirements for existing wireless standards. In some aspects, advanced topologies, such as a two-component decoder employing, for example, iterative demodulation and decoding, may achieve advantageous performance in emerging standards using a varying puncturing pattern, whereas such advanced topologies may, in some aspects, not necessarily be beneficial for existing standards. The skilled person would appreciate that a puncturing pattern used in existing standards (e.g., puncturing first two variable nodes in LDPC of NR/5G) may not necessarily meet all requirements of such emerging standards, for instance, with regard to power available for decoding, number of available decoding iterations, and/or the like. In contrast, the use of a varying puncturing pattern may be useful to meet such requirements. The skilled person will appreciate that, in general, the use of a varying puncturing pattern may have no impact on decoder (e.g., decoder 412) in terms of, for example, its hardware structure, in particular, for a given BG. This is because the punctured one or more nodes (and/or corresponding bits) may be provided to decoder input as an initial metric indicating a lowest reliability (e.g., for example, $LLR(x_i)=0$, where $x_i$ may denote the one or more punctured bits).

Figure 6A:
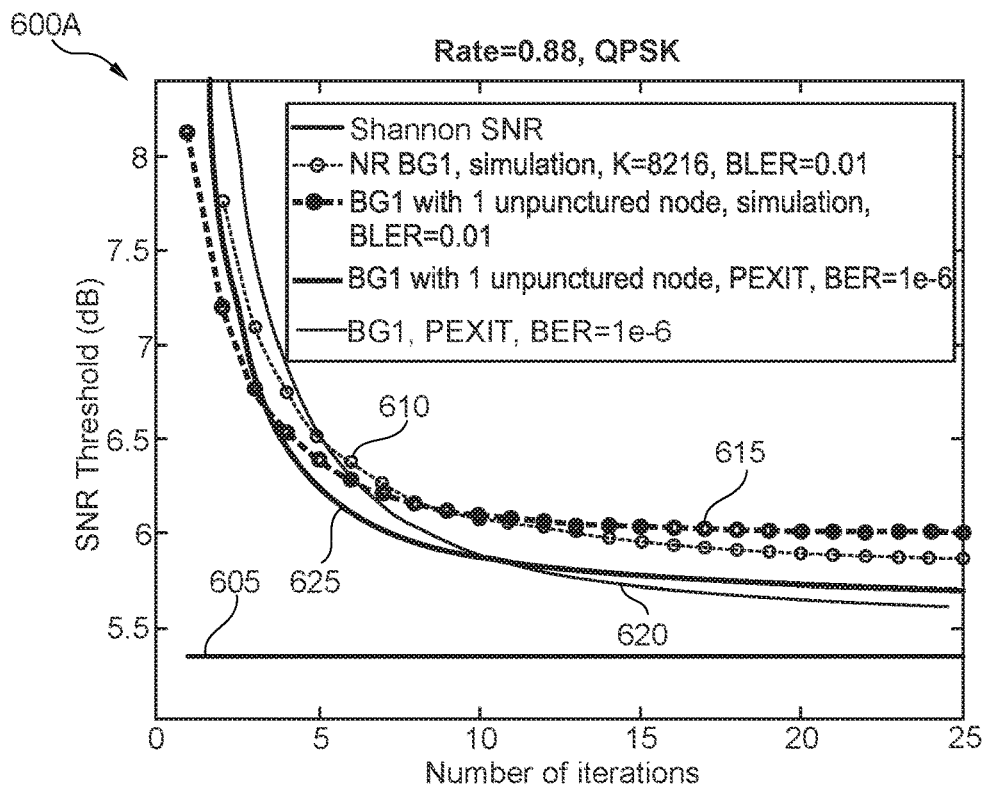
FIG. 6A shows a diagram 600A illustrating decoding performance for a coding rate 0.88 and a Quadrature Phase-Shift Keying (QPSK) modulation in accordance with various aspect of the present disclosure.

FIG. 6A shows a diagram 600A illustrating decoding performance for a coding rate 0.88 and a Quadrature Phase-Shift Keying (QPSK) modulation in accordance with various aspects of the present disclosure. The diagram 600A shows decoding performance indicated in terms of a signal-to-noise-ratio (SNR) threshold expressed in decibel (dB) as a function of a number of decoding iterations performed by a decoder, in dependence on various parameters and/or schemes. As used herein, the term "SNR threshold" may refer to a SNR which is required to achieve a target performance, for example, in terms of a block error rate (BLER) and/or a bit error rate (BER), as described below. In the illustrated example, line 605 indicates a performance limit (which may be sometimes referred to as a Shannon limit) for the coding rate 0.88 and the QPSK modulation. In the illustrated example, lines 610 and 615 indicate decoding performance in terms of the SNR threshold for a BLER equal to 0.01. Line 610 may show a result of an analysis for a base graph 1 (BG1) of the LDPC of NR with a message length of 8216 bits, whereas line 615 may show a result of an analysis for a modified code. The modified code may be a modification of NR LDPC BG1 with regard to a puncturing pattern, in which one node, for example, the second column in a matrix representation, is unpunctured (i.e., not punctured).

In some aspect of the present disclosure, comparison of lines 610 and 615 may reveal that, for a low number of decoding iterations, such as for less than 8 iterations, a code with one unpunctured node (relative to BG1 in NR) may achieve better performance relative to a regularly punctured code as in NR due to having a lower SNR threshold (e.g., for less than 8 iterations, line 615 may be closer to the abscissa as compared to line 610). Conversely, for a high number of decoding iterations, for instance, for more than 11 iterations, the regularly punctured code as in NR may achieve better performance relative to the code with one unpunctured node due to having a lower SNR threshold (e.g., line 610 may be closer to the abscissa as compared to line 615).

Similarly, in the illustrated example, lines 620 and 625 indicate decoding performance in terms of the SNR threshold for a BER of 1.0e-6 for the code punctured as in BG1 of NR and for the code with one unpunctured node, respectively. Analysis regarding lines 620 and 625 may involve the use of a protograph-based extrinsic information transfer (PEXIT). Comparison of lines 620 and 625 may reveal that, for a low number of decoding iterations, such as for less than 11 iterations, the code with one unpunctured node may achieve better performance relative to the code punctured in accordance with LDPC BG1 of NR (e.g., line 625 is closer to the abscissa as compared to line 620). Conversely, for a high number of decoding iterations, for instance, for more than 12 iterations, the punctured code as in NR may achieve better performance relative to the code with one unpunctured node (e.g., line 620 may be closer to the abscissa as compared to line 625).

Figure 6B:
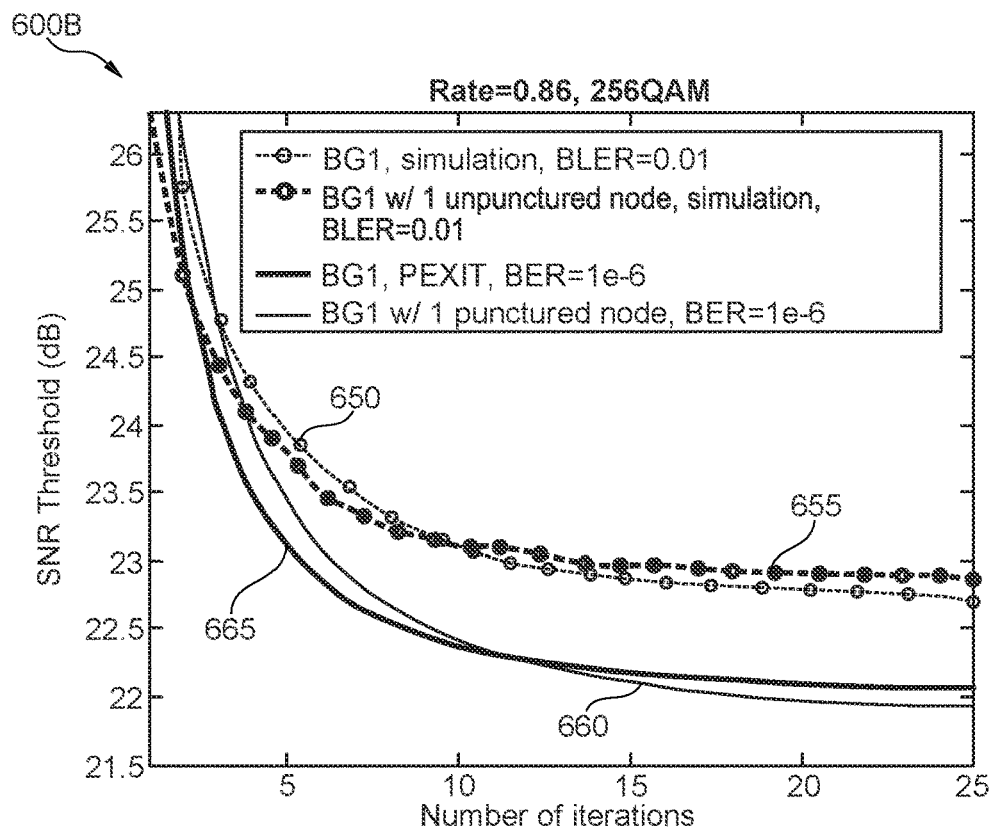
FIG. 6B shows a diagram illustrating decoding performance for a coding rate 0.86 and a 256 Quadrature Amplitude Modulation (256QAM) modulation in accordance with various aspects of the present disclosure.

FIG. 6B shows a diagram 600B illustrating decoding performance for a coding rate 0.86 and a 256-Quadrature Amplitude Modulation (256QAM) modulation in accordance with various aspects of the present disclosure. Similar to the diagram 600A, also the diagram 600B shows decoding performance in terms of the SNR threshold in dB as a function of a number of decoding iterations performed by a decoder, in dependence on various parameters and/or schemes. In the illustrated example, lines 650 and 655 indicate decoding performance in terms of the SNR threshold for a BLER equal to 0.01. Line 650 may show a result of an analysis for a NR LDPC BG1, whereas line 655 may show a result of an analysis for a modified code (e.g., a modified puncturing pattern relative to NR) in which one node, for example, the second column in a matrix representation is unpunctured (i.e., not punctured).

In some aspect of the present disclosure, similar as for the diagram 600A, comparison of lines 650 and 655 may reveal that, for a low number of decoding iterations, for instance, for less than 9 iterations, a code with one unpunctured node (relative to BG1 in NR) may achieve better performance relative to a regularly punctured code as in NR due to having a lower SNR threshold (e.g., for less than 9 iterations, line 655 may be closer to the abscissa as compared to line 650). Conversely, for a high number of decoding iterations, for instance, for more than 11 iterations, the regularly punctured code as in NR may achieve better performance relative to the code with one unpunctured node due to having a lower SNR threshold (e.g., line 650 may be closer to the abscissa as compared to line 655).

Similarly, in the illustrated example, lines 660 and 665 indicate decoding performance in terms of the SNR threshold for a BER of 1.0e-6 for the regularly punctured code in accordance with NR LDPC BG1 and for the code with one unpunctured node, respectively. Analysis regarding line 660 may involve the use of the PEXIT. Comparison of lines 660 and 665 may reveal that, for a low number of decoding iterations, such as for less than 10 iterations, the code with one unpunctured node may achieve better performance relative to the regularly punctured code in accordance with NR LDPC BG1 (e.g., line 665 is closed to the abscissa as compared to line 660). Conversely, for a high number of decoding iterations, for instance, for more than 12 iterations, the punctured code as in NR may achieve better performance relative to the code with one unpunctured node (e.g., line 660 may be closer to the abscissa as compared to line 665). In addition, in some aspect of the present disclosure, further modifications relative to NR LDPC (e.g., BG1) may be performed, for example, a special extension check (e.g., 5th row in the matrix representation) may be removed. Such modification may result in favorable decoding performance for requirements of emerging wireless standards.

As indicated above, FIGS. 6A and 6B are provided merely as an example. Other examples may differ from what is described with regard to FIGS. 6A and 6B.

Figure 7:
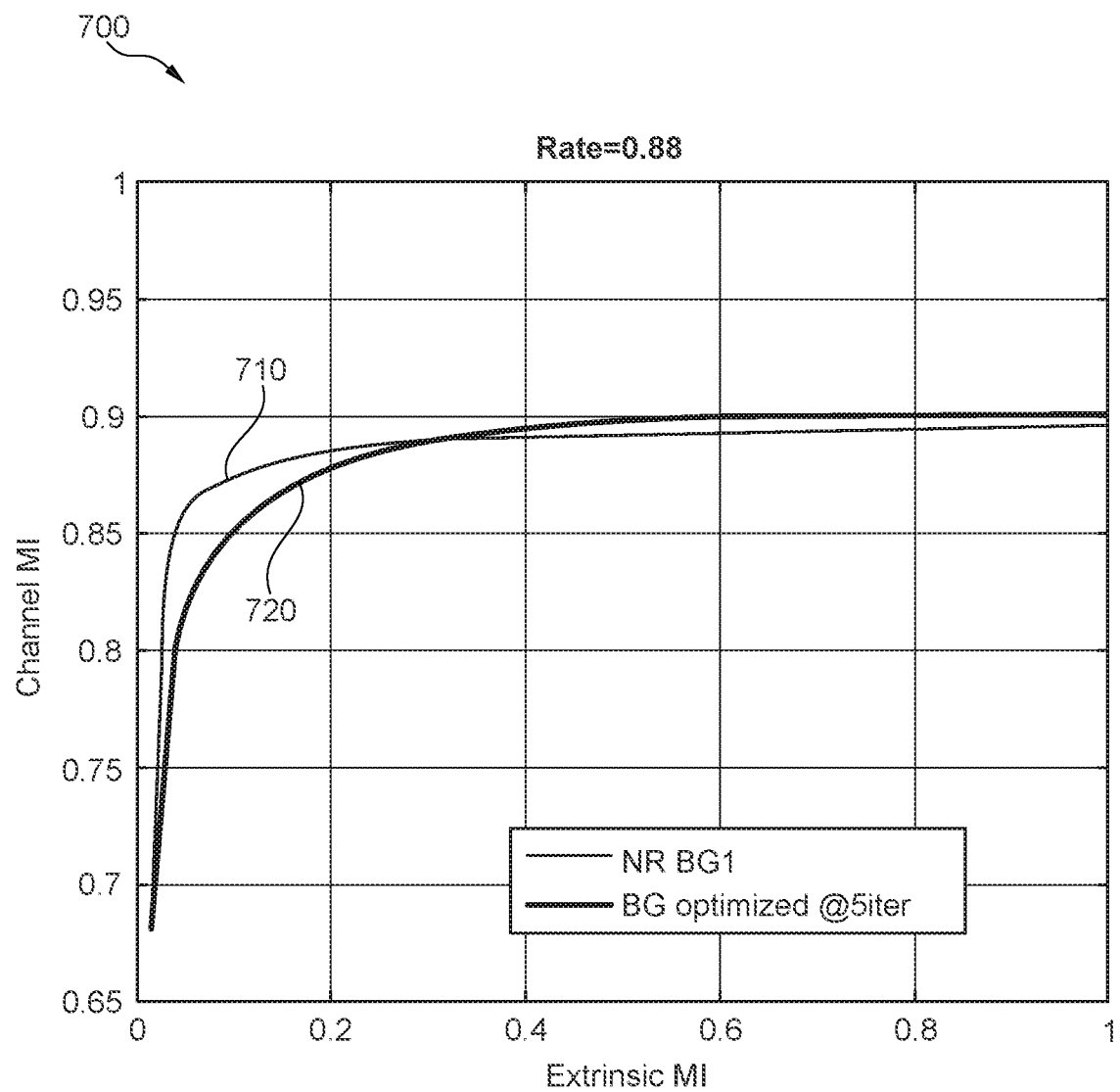
FIG. 7 is a diagram illustrating decoding performance for a coding rate 0.88 and a two-component decoder in accordance various aspects of the present disclosure.

FIG. 7 is a diagram 700 illustrating decoding performance for a coding rate 0.88 and a two-component decoder in accordance various aspects of the present disclosure. The diagram 700 shows decoding performance indicated in terms of channel mutual information (MI) as a function of extrinsic MI of a decoder having an advanced topology, such as a two-component decoder employing, for example, iterative demodulation and decoding. In the illustrated example, line 710 indicates achievable MI for a code in accordance with NR LDPC BG1, whereas line 720 indicates achievable MI for a code with a BG designed for a small number of decoding iterations (e.g., optimized at 5 iterations). The skilled person will appreciate that NR LDPC codes which are optimized for an additive white Gaussian noise (AWGN) channel, at a high number of decoding iterations, may offer a limited performance gain under iterative demodulation and decoding. For example, limited extrinsic information may be obtained from the decoder when channel condition is unfavorable (e.g., at high noise). In addition, in some aspects, a BG designed for a lower number of decoding iterations (e.g., faster convergence) may offer better performance under iterative demodulation and decoding (and vice versa).

As indicated above, FIG. 7 is provided merely as an example. Other examples may differ from what is described with regard to FIG. 7.

Figure 8:
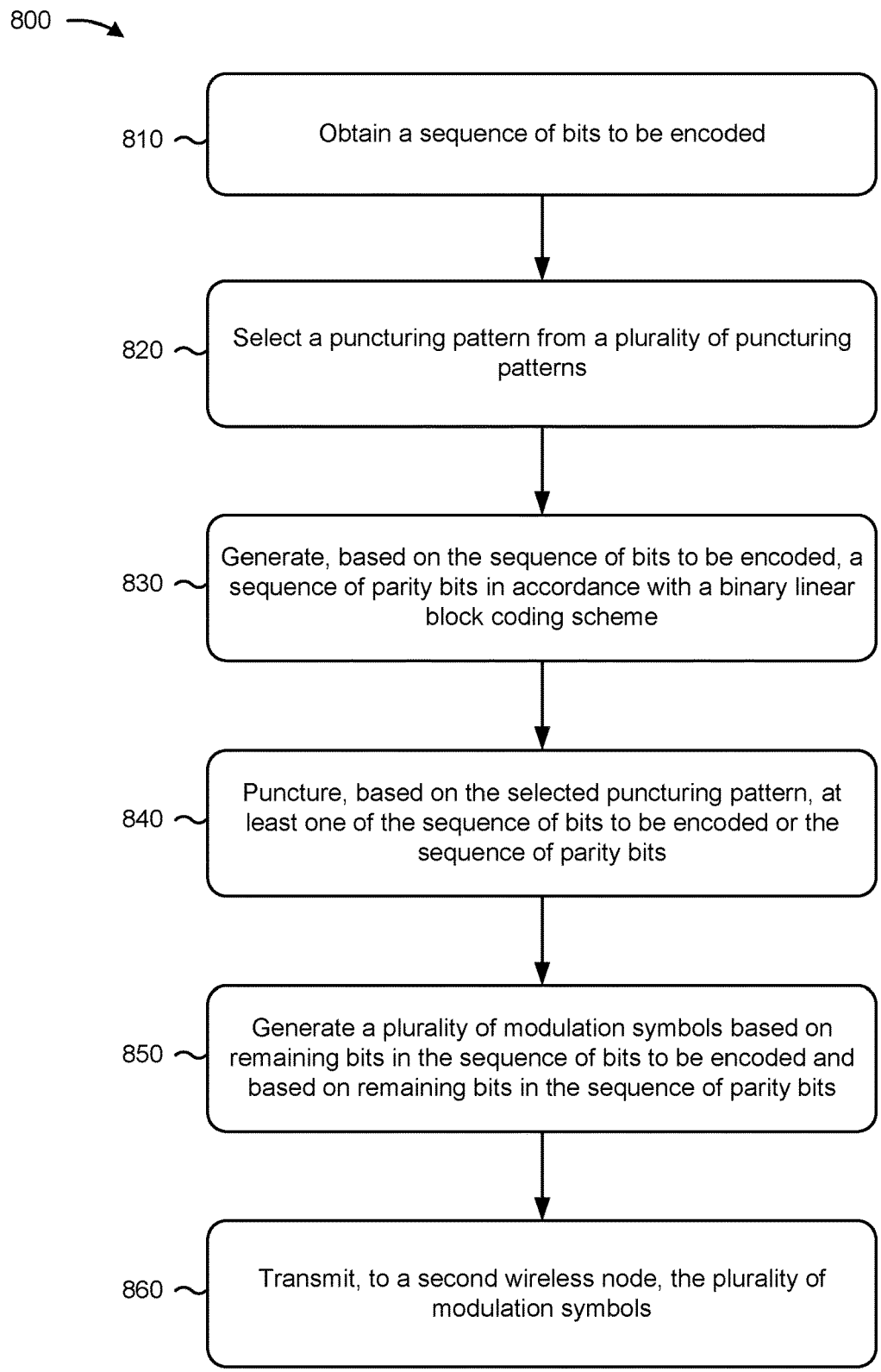
FIG. 8 is a diagram illustrating an example process performed at a first wireless node in accordance with various aspects of the present disclosure.

FIG. 8 is a diagram illustrating an example process 800 performed at a first wireless node in accordance with various aspects of the present disclosure. In some aspects, the first wireless node may comprise a base station 110 or a UE 120. In some aspects, process 800 may be implemented by a portion of transmit processor 220 of base station 110, or by a portion of transmit processor 264 of UE 120, or any suitable component of base station 110, UE 120, encoder 402, and/or the like. In some aspects, process 800 may include additional blocks, fewer blocks, different blocks, or differently arranged blocks than those depicted in FIG. 8. Additionally, or alternatively, two or more of the blocks of process 800 may be performed in parallel.

As shown in FIG. 8, process 800 may include obtaining a sequence of bits to be encoded (block 810). In some aspects, the sequence of bits to be encoded may be composed of K bits. In some aspects, the sequence of bits to be encoded may comprise (or be equal to) an input message for channel coding such as a message m 404 described above. In some aspects, the sequence of bits to be encoded may correspond to PDSCH, PUSCH, and/or the like.

As further shown in FIG. 8, in some aspects, process 800 may include selecting a puncturing pattern from a plurality of puncturing patterns (block 820). In some aspects, a plurality of binary linear block codes (e.g., NR LDPC BGs, and/or the like) may be defined in a wireless standard. For each of such codes, a plurality of puncturing patterns may be defined. For example, a first pattern specifying to puncture the first two variable nodes in a matrix representation of a code (e.g., a binary linear block code, and/or the like), a second pattern specifying to puncture only the first variable node in the matrix representation, and/or the like. The puncturing pattern may be selected based on various criteria and/or parameters, as described above, and as will be additionally described below.

In addition, as shown in FIG. 8, in some aspects, process 800 may include generating, based on the sequence of bits to be encoded, a sequence of parity bits in accordance with a binary linear block coding scheme (block 830). In some aspects, the sequence of parity bits may be composed of N−K bits, where N may denote a length of a codeword. As described above, in some aspects, the codeword may be composed of (e.g., be a concatenation of) the sequence of bits to be encoded (which may be referred to as systematic bits) and the parity bits, and may correspond to codeword x 406 described above. The codeword may be generated based on a parity-check matrix of the binary linear block code (e.g., matrix H such that Hx=0).

Moreover, as shown in FIG. 8, in some aspects, process 800 may include puncturing, based on the selected puncturing pattern, at least one of the sequence of bits to be encoded or the sequence of parity bits (block 840). In some aspects, one or more bits corresponding to the selected puncturing pattern may be determined (e.g., marked, flagged, or/or the like) as not to be transmitted. In some aspects, puncturing may involve puncturing one or more systematic bits, one or more parity bits, or any combination thereof. In some aspects, the one or more bits corresponding to the puncturing pattern may not be considered (e.g., may not be referenced, or accessed) in subsequent processing steps.

As further shown in FIG. 8, in some aspects, process 800 may include generating a plurality of modulation symbols based on remaining bits in the sequence of bits to be encoded and based on remaining bits in the sequence of parity bits (block 850). The expression "remaining bits" as used herein may refer to bits which are not punctured in the preceding step, and may in some aspects comprise a single remaining bit. In some aspects, generating the plurality of modulation symbols may involve bits selection in accordance with a HARQ process such that not all remaining bits but only a subset of remaining bits is used to generate respective modulation symbols. This applies to both systematic bits and parity bits. In some aspects, generating the plurality of modulation symbols is based a modulation scheme (such as QPSK, 256QAM, and/or the like).

Furthermore, as shown in FIG. 8, in some aspects, process 800 may include transmitting, to a second wireless node, the plurality of modulation symbols (block 860). In some aspects, the first wireless node may comprise (or be equal to) a base station (e.g., base station 110) and the second wireless node may comprise (or be equal to) a UE (e.g., UE 120). In other aspects, the first wireless node may comprise (or be equal to) a UE (e.g., UE 120) and the second wireless node may comprise (or be equal to) a base station (e.g., base station 110). In some aspects, transmitting the plurality of modulation symbols may involve the use of a channel (e.g., channel 408), and/or the like.

In one or more aspects of the present disclosure, in process 800, the binary linear block coding scheme may comprise (or be equal to) a low-density parity-check (LDPC) coding scheme, for example, NR LDPC BG1 coding scheme. In other aspects, various binary linear block coding schemes such as Hamming code, Reed-Muller code, polar code and/or the like may be used.

In one or more of the above aspects, process 800 may further include selecting, from a plurality of base graphs, a base graph (BG) to be used in the low-density parity-check coding scheme, and the puncturing pattern may be selected based on the BG. In some aspects, for example, two or more BGs may be defined (e.g., BG1 and BG2 as in NR LDPC, and/or the like) in a wireless standard. In some aspects, for example, the BG to be used may be selected based on a length of the sequence of bits to be encoded (e.g., length K of message m 404) and/or a desired coding rate R. The puncturing pattern to be used may be selected based on the selected BG. For instance, for a first BG (e.g., BG1), a first puncturing pattern comprising only one variable node (e.g., first column in the matrix representation) may be selected. For a second BG (e.g., BG2), a second puncturing pattern comprising two variable nodes (e.g., first and second column in the matrix representation, as in NR) may be selected. The skilled person will appreciate that a different number of BGs and a different number of puncturing patterns with varying configurations of nodes and/or bits to be punctured may be used. Selecting a puncturing pattern depending on a BG may lead to advantageous decoding performance, as described for BG1 of NR above.

In one or more of the above aspects, in process 800, the puncturing pattern may be selected based on at least one of a length of the sequence of bits to be encoded, a coding rate associated with the sequence of bits to be encoded, or a combination thereof. For example, in some aspects, for a certain length (or one or more ranges of the length) of the sequence of bits to be encoded (e.g., length K of message m 404), a particular puncturing pattern (e.g., a pattern with only one punctured variable node, a pattern with two or more punctured variable nodes, and/or the like) may lead to advantageous decoding performance. Similarly, for a certain coding rate (e.g., rate R) or one or more ranges of the coding rate, a particular puncturing pattern may lead to advantageous decoding performance. The skilled person will appreciate that the above may also apply to a combination of the length K and the coding rate R such that mapping from a pair (K, R) to a puncturing pattern may be applied.

In one or more of the above aspects, in process 800, the puncturing pattern may be selected based on at least one of a data rate associated with the sequence of bits to be encoded, a latency requirement associated with the sequence of bits to be encoded, an error rate requirement associated with the sequence of bits to be encoded, or any combination thereof. For example, in some aspects, various types of communication such as enhanced Mobile Broadband (eMBB), Ultra Reliable Low Latency Communications (URLLC), or massive Machine Type Communications (mMTC) may have different requirements with regard to data rate, latency requirement and/or error rate requirement. In some aspects, eMBB may require higher throughput relative to other types of communications (and/or offer less power for decoding) such that the use of a lower number of decoding iterations may be required and/or preferred. In such cases, the use of a puncturing pattern designed for a lower number of decoding iterations, for example, a pattern with only one punctured variable node, may be advantageous, as described above. In other aspects, URLLC and/or mMTC may require higher reliability (e.g., lower error rate such as BLER, BER and/or the like) relative to eMBB such that the use of a higher number of decoding iterations may be required and/or preferred. In such cases, the use of a puncturing pattern designed for a lower error rate, but possibly leading to a higher number of decoding iterations, for example, a pattern with two punctured variable nodes (e.g., as in NR) may be advantageous, as described above. The skilled person will appreciate that depending on requirements (such as data rate, latency requirement and/or error rate requirement), various puncturing patterns may be designed to make use of a tradeoff involving a number of decoding iterations, performance (e.g., SNR threshold), power needed for decoding, and/or the like, as described above.

In one or more of the above aspects, in process 800, the puncturing pattern may be selected based on a type of receiver used by the second wireless node. For example, the first wireless node may be pre-configured with, or may otherwise determine, a type of receiver used by the second wireless node. In some aspects, a type of a receiver may comprise a receiver with a two-component decoder employing, for example, iterative demodulation and decoding, and a receiver with a single-component decoder employing, for example, sequential demodulating and then decoding. In such cases, in some aspects, the first wireless node may select a first puncturing pattern (e.g., a pattern with only one punctured variable node) if the second wireless node uses an advanced receiver, for instance, the two-component decoder, as described above. In other cases, for example, the first wireless node may select a second puncturing pattern (e.g., a pattern with two or more punctured variable nodes) if the second wireless node uses a conventional receiver, for instance, the single-component decoder, as described above. The skilled person will appreciate that for various receiver types, and in dependence thereon, various puncturing patterns may be designed which, for a particular type of receiver, exhibit certain advantages such as a lower number of required decoding iterations, a lower power required for decoding, and/or a lower error rate (e.g., BLER, BER), and/or the like.

In one or more of the above aspects, process 800 may further include determining an indication of a type of receiver used by the second wireless node, and the puncturing pattern may be selected based on the indication of the type of receiver. In some aspects, determining the indication may comprise receiving the indication, for example, from the second wireless node and/or some other suitable network entity. For example, determining the indication may comprise receiving the indication in (and/or deriving it from) a feature group indicator (FGI) defined in 5G/NR, and/or the like. In addition, or alternatively, determining the indication may comprise deriving it from any suitable (pre-configured and/or received) information available at the first wireless node. The description above with regard to selecting the puncturing pattern based on a type of the receiver used by the second wireless node applies accordingly.

In one or more of the above aspects, in process 800, the puncturing pattern may be selected based on a maximum number of decoding iterations which the second wireless node is configured to perform for decoding in accordance with the low-density parity-check coding scheme. For example, the first wireless node may be pre-configured with, or may otherwise determine, the maximum number of decoding iterations which the second wireless node is configured to perform for decoding. In some aspects, the maximum number of iterations may correspond, for example, to a constraint on decoding time given a data rate, and/or power available for decoding (which may be, for example, substantially proportional to the number of performed decoding iterations). In such cases, given the maximum number of decoding iterations, the first wireless node may select a puncturing pattern which may facilitate achieving required decoding performance (e.g., with regard to error rate such as BLER, BER, and/or the like) whilst not exceeding the maximum number of decoding iterations. For example, as described above, a first puncturing pattern with only one punctured variable node may be selected if the maximal number of decoding iterations is less than or equal to a threshold (e.g., a first threshold). In addition, for example, a second puncturing pattern with two punctured variable nodes may be selected if the maximal number of decoding iterations is greater than or equal to a threshold (e.g., the first threshold).

In one or more of the above aspects, process 800 may further include determining an indication of a maximum number of decoding iterations which the second wireless node is configured to perform for decoding in accordance with the low-density parity-check coding scheme, and the puncturing pattern may be selected based on the indication of the maximum number of decoding iterations. Similar as above, in some aspects, determining the indication may comprise receiving the indication, for example, from the second wireless node and/or some other suitable network entity. For example, determining the indication may comprise receiving the indication in (and/or deriving it from) a feature group indicator (FGI) defined in 5G/NR, and/or the like. In addition, or alternatively, determining the indication may comprise deriving it from any suitable (pre-configured and/or received) information available at the first wireless node. The description above with regard to selecting the puncturing pattern based on a maximum number of decoding iterations applies accordingly.

In one or more aspects of the present disclosure, process 800 may further include transmitting, to the second wireless node, an indication of the selected puncturing pattern, the indication of the selected puncturing pattern may be transmitted using at least one of radio resource control (RRC) signaling, medium access control (MAC) layer signaling, physical (PHY) layer signaling, or any combination thereof. For example, the first wireless node may share its decision with regard to selection of the puncturing pattern with the second wireless node by using suitable signaling such that the second wireless node may not autonomously select the puncturing pattern but rather may follow the selection performed by the first wireless node.

In one or more aspects of the present disclosure, in process 800, the plurality of puncturing patterns may comprise a first puncturing pattern specifying to puncture all bits corresponding to only two variable nodes and a second puncturing pattern specifying to puncture all one or more bits corresponding to only one variable node. In some aspects, the first puncturing pattern may comprise (or be equal to) the puncturing pattern for NR LDPC BG1 or NR LDPC BG2. In other aspects, the first puncturing pattern may comprise (or be equal to) any suitable puncturing pattern specifying puncturing zero, one or two variable nodes corresponding to systematic bits and/or zero, one or two variable nodes corresponding to parity bits such that in total two variable nodes (e.g., all bits corresponding to these two respective variable nodes) are punctured. In some aspects, the second puncturing pattern may comprise (or be equal to) the puncturing pattern for NR LDPC BG1 or NR LDPC BG2 with one variable node being unpunctured. In other aspects, the second puncturing pattern may comprise (or be equal to) any suitable puncturing pattern specifying puncturing either only one variable node corresponding to systematic bit (in case lifting is not applied) or bits (in case lifting is applied) or only one variable node corresponding to parity bit (in case lifting is not applied) or bits (in case lifting is applied). In addition, in some aspects, the plurality of pattern may include additional puncturing patterns (e.g., patterns different from the first puncturing pattern and different from the second puncturing pattern).

In one or more aspects of the present disclosure, in process 800, generating the plurality of modulation symbols may further comprise generating the plurality of modulation symbols based on the remaining bits in the sequence of bits to be encoded and based on the remaining bits in the sequence of parity bits using a modulation scheme. In some aspects, such remaining bits may be mapped to a block of complex-valued modulation symbols using a modulation scheme such as QPSK or $2^{Q_m}$ QAM, where $Q_m$ may denote a modulation order and may be equal to 4, 6, 8, 10, 12, etc. (and hence result in 16QAM, 64QAM, 256QAM, 1024QAM, 4096QAM, etc.), and/or the like.

In one or more aspects of the present disclosure, as an alternative or in addition to the aspects described above, for instance, in process 800, the first wireless node and/or the second wireless node may be configured to operate at least in part in accordance with one or more Technical Specifications (TS) produced by a third Generation Partnership Project (3GPP).

Figure 9:
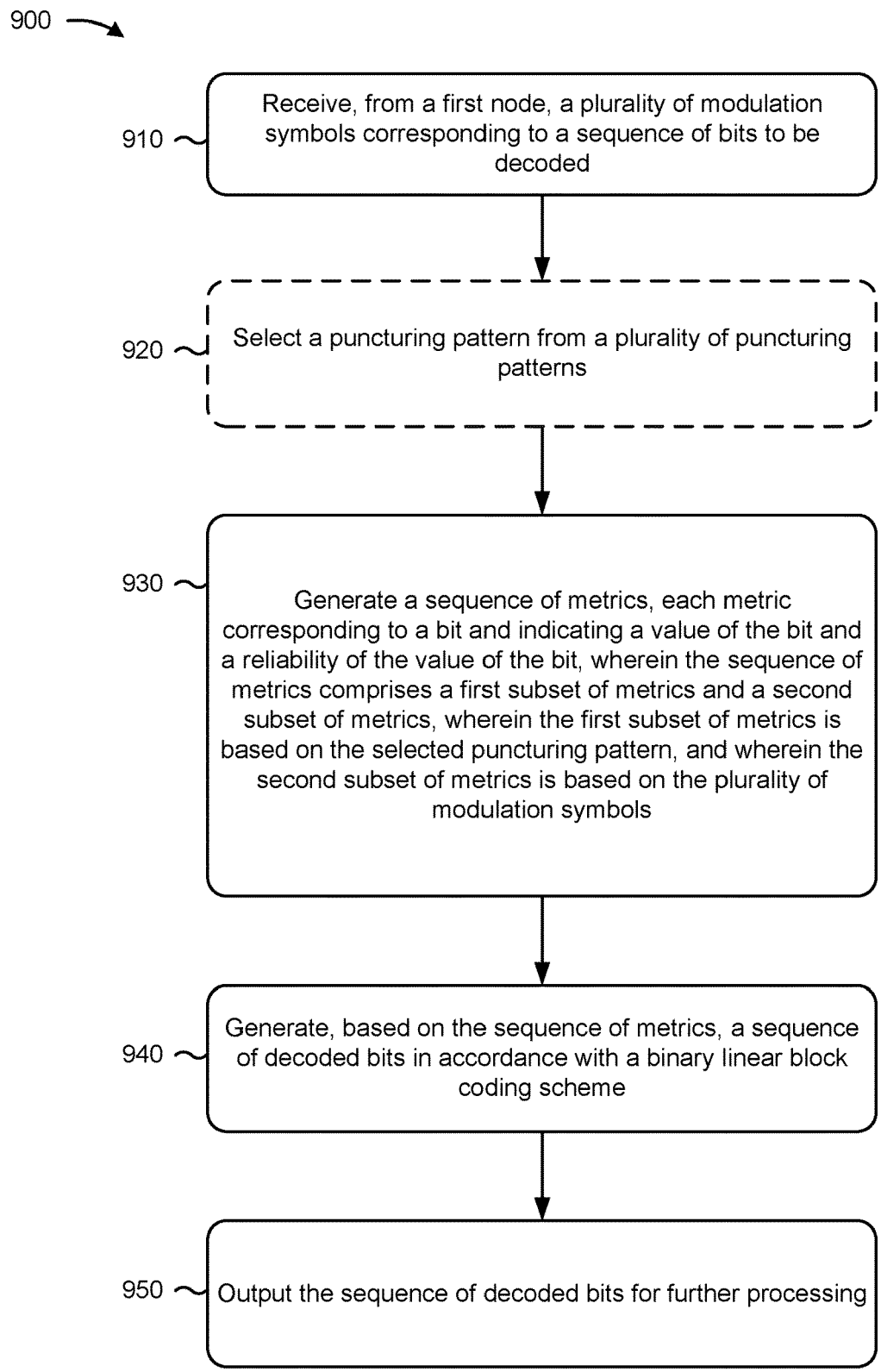
FIG. 9 is a diagram illustrating an example process performed at a second wireless node in accordance with various aspects of the present disclosure.

FIG. 9 is a diagram illustrating an example process 900 performed at a second wireless node in accordance with various aspects of the present disclosure. In some aspects, the second wireless node may comprise a base station 110 or a UE 120. In some aspects, process 900 may be implemented by a portion of receive processor 238 of base station 110, or by a portion of receive processor 258 of UE 120, or any suitable component of base station 110, UE 120, decoder 412, and/or the like. In some aspects, process 900 may include additional blocks, fewer blocks, different blocks, or differently arranged blocks than those depicted in FIG. 9. Additionally, or alternatively, two or more of the blocks of process 900 may be performed in parallel.

As shown in FIG. 9, process 900 may include receiving, from a first node, a plurality of modulation symbols corresponding to a sequence of bits to be decoded (block 910). In some aspects, the plurality of modulation symbols may correspond (e.g., partly, or completely) to message m 404 to which encoding and/or modulation was applied. In some aspects, the first wireless node may comprise (or be equal to) a base station (e.g., base station 110) and the second wireless node may comprise (or be equal to) a UE (e.g., UE 120). In other aspects, the first wireless node may comprise (or be equal to) a UE (e.g., UE 120) and the second wireless node may comprise (or be equal to) a base station (e.g., base station 110). In some aspects, receiving the plurality of modulation symbols may involve the use of a channel (e.g., channel 408), and/or the like.

As further shown in FIG. 9, in some aspects, process 900 may include selecting a puncturing pattern from a plurality of puncturing patterns (block 920). This aspect may be optional as described below. In some aspects, plural binary linear block codes (e.g., NR LDPC BGs, and/or the like) may be defined in a wireless standard. For each of such codes, a plurality of puncturing patterns may be defined. For example, a first pattern specifying to puncture first two variable nodes in a matrix representation of a code (e.g., a binary linear block code, and/or the like), a second pattern specifying to puncture only first variable node in the matrix representation, and/or the like. The puncturing pattern may be selected based on various criteria and/or parameters, as described above, and as will be additionally described below.

Alternatively, instead of selecting a puncturing pattern from a plurality of puncturing patterns at the second wireless node, only one puncturing pattern may be employed by the second wireless node and an indication (e.g., with regard to a type of receiver used by the second wireless node, a maximum number of decoding iterations which the second node is configured to perform for decoding, and/or the like), as described below, may be transmitted to the first wireless node to enable the first wireless node to select the puncturing pattern based on the indication (block not shown).

In addition, as shown in FIG. 9, in some aspects, process 900 may include generating a sequence of metrics, each metric corresponding to a bit and indicating a value of the bit and a reliability of the value of the bit (block 930). The sequence of metrics may comprise a first subset of metrics and a second subset of metrics, the first subset of metrics may be based on the selected puncturing pattern and the second subset of metrics may be based on the plurality of modulation symbols. In some aspects, for example, the sequence of metrics may correspond (e.g., partly, or completely) to codeword x 406 and it may be composed of N or less elements. In some aspects, each metric in the sequence of metrics may comprise (or be equal t0) an LLR, as described above. In some aspects, the first subset of metrics may correspond to those one or more bits to which puncturing is applied such that no corresponding one or more modulation symbols were transmitted by the first wireless node (and hence such symbols are not received by the second wireless node). In some aspects, each metric in the first subset of metrics may indicate that the second wireless node does not possess any information with regard to a value of corresponding one or more bits. For example, the value may be set to indeterminate, and/or the reliability may be set to a lowest reliability (e.g., LLR $(x_i)$=0, where $x_i$ may denote the one or more punctured bits). In some aspects, the second subset of metrics may correspond to those one or more bits to which no puncturing is applied such that corresponding one or more modulation symbols were transmitted by the first wireless node (and hence such symbols are received by the second wireless node). In some aspects, each metric in the second subset of metrics may indicate information possessed by the second wireless node with regard to a value of corresponding one or more bits (e.g., logical 0, logical 1) and associated reliability, and may, for example, comprise (or be equal to) an LLR as described above. In some aspects, respective reliability may be obtained based on determined deterioration of respective modulation symbol relative to this symbol as defined in a wireless standard (e.g., based on Euclidean distance, and/or the like).

Moreover, as shown in FIG. 9, in some aspects, process 900 may include generating, based on the sequence of metrics, a sequence of decoded bits in accordance with a binary linear block coding scheme (block 940). In some aspects, the sequence of decoded bis may be composed of K bits. In some aspects, the sequence of decoded bits may comprise (or be equal to) an output message from channel coding such as decoded message m' 414. The sequence of decoded bits may be generated based on a parity-check matrix of the binary linear block code (e.g., matrix H such that Hx=0). In some aspects, generating the sequence of decoded bits may involve iterative message passing, as described above, by using, for example, a single-component decoder, a two-component decoder, and/or the like, as described above.

Furthermore, as shown in FIG. 9, in some aspects, process 900 may include outputting the sequence of decoded bits for further processing. In some aspects, the sequence of the decoded bits may be output to data sink 293 of base station 110. In other aspects, the sequence of decoded bits may be output to data sink 260 of UE 120. In some aspects, the sequence of decoded bits may correspond to PDSCH, PUSCH, and/or the like.

In one or more of the above aspects, generating the sequence of metrics may comprise setting each metric in the first subset of metrics to indicate a lowest reliability of the respective bit. For example, in some aspects, the lowest reliability may be indicated (e.g., to decoder 412, and/or the like) by setting LLR $(x_i)$=0, where $x_i$ may denote the one or more punctured bits. Thus, as described above, use of varying puncturing pattern may have no impact on decoder (e.g., decoder 412) in terms of, for example, its hardware structure since adapting input to the same hardware structure (e.g., setting LLR to 0 for the one or more punctured bits) may suffice.

In one or more of the above aspects, in process 900, generating the sequence of decoded bits may comprise steps which are independent of the puncturing pattern. For instance, as described above, in some aspects, the same hardware structure (e.g., hardware structure of decoder 412) may be used for varying puncturing patterns (e.g., there may be no impact of puncturing pattern on decoder hardware itself). In some aspects, this hardware structure may perform the same steps to generate the sequence of decoded bits irrespective of the selected puncturing patterns, for example, for a given BG. Rather, whether one or more bits and/or nodes are punctured may be reflected by appropriate input provided to the decoder (e.g., setting each metric in the first set of metrics corresponding to the puncturing pattern to indicate a lowest reliability of the one or more punctured bits and/or nodes).

In one or more aspects of the present disclosure, in process 900, the binary linear block coding scheme may comprise (or be equal to) a low-density parity-check (LDPC) coding scheme, for example, NR LDPC BG1 coding scheme. In other aspects, various binary linear block coding schemes such as Hamming code, Reed-Muller code, polar code and/or the like may be used.

In one or more of the above aspects, process 900 may further include selecting, from a plurality of base graphs, a base graph (BG) to be used in the low-density parity-check coding scheme, and the puncturing pattern may be selected based on the BG. The skilled person will appreciate that this aspect is described in more detail above in the context of FIG. 8 and that this description applies accordingly to FIG. 9.

In one or more of the above aspects, in process 900, the puncturing pattern may be selected based on at least one of a length of the sequence of decoded bits, a coding rate associated with the sequence of decoded bits, or a combination thereof. The skilled person will appreciate that this aspect is described in more detail above in the context of FIG. 8 and that this description applies accordingly to FIG. 9.

In one or more of the above aspects, in process 900, the puncturing pattern may be selected based on at least one of a data rate associated with the sequence of decoded bits, a latency requirement associated with the sequence of decoded bits, an error rate requirement associated with the sequence of decoded bits, or any combination thereof. The skilled person will appreciate that this aspect is described in more detail above in the context of FIG. 8 and that this description applies accordingly to FIG. 9.

In one or more of the above aspects, in process 900, the puncturing pattern may be selected based on a type of receiver used by the second wireless node. The skilled person will appreciate that this aspect is described in more detail above in the context of FIG. 8 and that this description applies accordingly to FIG. 9.

In one or more of the above aspects, process 900 may further include determining an indication of a type of receiver used by the second wireless node, and transmitting, to the first wireless node, the indication to enable the first wireless node to select the puncturing pattern based on the indication. In some aspects, determining the indication may comprise retrieving the type of the receiver from configuration information, from a decoder (e.g., decoder 412), deriving the indication from any suitable (pre-configured and/or received) information available at the second wireless node, and/or the like. In some aspects, transmitting the indication may comprise transmitting the indication (and/or information derived from the indication) in a feature group indicator (FGI) defined in 5G/NR, and/or the like. Any description above with regard to selecting the puncturing pattern based on a type of the receiver used by the second wireless node applies accordingly.

In one or more of the above aspects, in process 900, the puncturing pattern may be selected based on a maximum number of decoding iterations which the second wireless node is configured to perform for decoding in accordance with the low-density parity-check coding scheme. The skilled person will appreciate that this aspect is described in more detail above in the context of FIG. 8 and that this description applies accordingly to FIG. 9.

In one or more of the above aspects, process 900 may further include determining an indication of a maximum number of decoding iterations which the second wireless node is configured to perform for decoding in accordance with the low-density parity-check coding scheme, and transmitting, to the first wireless node, the indication to enable the first wireless node to select the puncturing pattern based on the indication. In some aspects, determining the indication may comprise retrieving the maximum number of decoding iterations which the second wireless node is configured to perform for decoding from configuration information, from a decoder (e.g., decoder 412), deriving the indication from any suitable (pre-configured and/or received) information available at the second wireless node, and/or the like. In some aspects, transmitting the indication may comprise transmitting the indication (and/or information derived from the indication) in a feature group indicator (FGI) defined in 5G/NR, and/or the like. Any description above with regard to selecting the puncturing pattern based on a maximum number of decoding iterations applies accordingly.

In one or more of the above aspects, process 900 may further include receiving, from the first wireless node, an indication of the puncturing pattern, the puncturing pattern may be selected, by the second wireless node, based on the received indication of the puncturing pattern. In some aspects, the indication of the selected puncturing pattern may be received using at least one of radio resource control (RRC) signaling, medium access control (MAC) layer signaling, physical (PHY) layer signaling, or any combination thereof. The skilled person will appreciate that this aspect is described in more detail above in the context of FIG. 8 and that this description applies accordingly to FIG. 9.

In one or more of the above aspects, in process 900, the plurality of puncturing patterns may comprise a first puncturing pattern specifying to puncture all bits corresponding to only two variable nodes and a second puncturing pattern specifying to puncture all one or more bits corresponding to only one variable node. The skilled person will appreciate that this aspect is described in more detail above in the context of FIG. 8 and that this description applies accordingly to FIG. 9.

In one or more of the above aspects, in process 900, generating the sequence of metrics may comprise generating the second subset of metrics based on the plurality of symbols using a modulation scheme. In some aspects, the plurality of modulation symbols (e.g., complex-valued modulation symbols) may be mapped to metrics of the second subset of metrics using a modulation scheme such that a respective metric indicates a value of a bit (e.g., a value of logical 0, or a value of logical 1). In addition, in some aspects, metrics of the second subset may be set to indicate a reliability of a bit based on a modulation scheme, for example, by determining suitable distance (e.g., Euclidian distance) of a received modulation symbol from a respective modulation symbol defined in a wireless standard. In some aspects, the modulation scheme may comprise (or be equal to) QPSK or $2^{Q_m}$ QAM, where $Q_m$ may denote a modulation order and may be equal to 4, 6, 8, 10, 12, etc. (and hence result in 16QAM, 64QAM, 256QAM, 1024QAM, 4096QAM, etc.), and/or the like.

In one or more aspects of the present disclosure, as an alternative or in addition to the aspects described above, the first wireless node and/or the second wireless node may be configured to operate at least in part in accordance with one or more Technical Specifications (TS) produced by a third Generation Partnership Project (3GPP).

In the following, several aspects of the present disclosure are presented:

Aspect 1. A method of wireless communication, the method performed at a first wireless node, the method comprising:
  obtaining a sequence of bits to be encoded;
  selecting a puncturing pattern from a plurality of puncturing patterns;
  generating, based on the sequence of bits to be encoded, a sequence of parity bits in accordance with a binary linear block coding scheme;
  puncturing, based on the selected puncturing pattern, at least one of the sequence of bits to be encoded or the sequence of parity bits;
  generating a plurality of modulation symbols based on remaining bits in the sequence of bits to be encoded and based on remaining bits in the sequence of parity bits; and
  transmitting, to a second wireless node, the plurality of modulation symbols.

Aspect 2. The method of aspect 1, wherein the binary linear block coding scheme comprises a low-density parity-check coding scheme.

Aspect 3. The method of any one of aspects 1 to 2, further comprising:
  selecting, from a plurality of base graphs, a base graph to be used in the low-density parity-check coding scheme; and
  wherein the puncturing pattern is selected based on the base graph.

Aspect 4. The method of any one of aspects 1 to 3, wherein the puncturing pattern is selected based on at least one of a length of the sequence of bits to be encoded, a coding rate associated with the sequence of bits to be encoded, or a combination thereof.

Aspect 5. The method of any one of aspects 1 to 4, wherein the puncturing pattern is selected based on at least one of a data rate associated with the sequence of bits to be encoded, a latency requirement associated with the sequence of bits to be encoded, an error rate requirement associated with the sequence of bits to be encoded, or any combination thereof.

Aspect 6. The method of any one of aspects 1 to 5, wherein the puncturing pattern is selected based on a type of receiver used by the second wireless node.

Aspect 7. The method of any one of aspects 1 to 6, further comprising:
determining an indication of a type of receiver used by the second wireless node; and
wherein the puncturing pattern is selected based on the indication of the type of receiver.

Aspect 8. The method of any one of aspects 1 to 7, wherein the puncturing pattern is selected based on a maximum number of decoding iterations which the second wireless node is configured to perform for decoding in accordance with the low-density parity-check coding scheme.

Aspect 9. The method of any one of aspects 1 to 8, further comprising:
determining an indication of a maximum number of decoding iterations which the second wireless node is configured to perform for decoding in accordance with the low-density parity-check coding scheme; and
wherein the puncturing pattern is selected based on the indication of the maximum number of decoding iterations.

Aspect 10. The method of any one of aspects 1 to 9, further comprising:
transmitting, to the second wireless node, an indication of the selected puncturing pattern.

Aspect 11. The method of any one of aspects 1 to 10, wherein the indication of the selected puncturing pattern is transmitted using at least one of radio resource control (RRC) signaling, medium access control (MAC) layer signaling, physical (PHY) layer signaling, or any combination thereof.

Aspect 12. The method of any one of aspects 1 to 11, wherein the plurality of puncturing patterns comprises a first puncturing pattern specifying to puncture all bits corresponding to only two variable nodes and a second puncturing pattern specifying to puncture all one or more bits corresponding to only one variable node.

Aspect 13. The method of any one of aspects 1 to 12, wherein generating the plurality of modulation symbols further comprises generating the plurality of modulation symbols based on the remaining bits in the sequence of bits to be encoded and based on the remaining bits in the sequence of parity bits using a modulation scheme.

Aspect 14. A method of wireless communication, the method performed at a second wireless node, the method comprising:
receiving, from a first node, a plurality of modulation symbols corresponding to a sequence of bits to be decoded;
selecting a puncturing pattern from a plurality of puncturing patterns;
generating a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols;
generating, based on the sequence of metrics, a sequence of decoded bits in accordance with a binary linear block coding scheme; and
outputting the sequence of decoded bits for further processing.

Aspect 15. The method of aspect 14, wherein generating the sequence of metrics comprises setting each metric in the first subset of metrics to indicate a lowest reliability of the respective bit.

Aspect 16. The method of any one of aspects 14 to 15, wherein generating the sequence of decoded bits comprises steps which are independent of the puncturing pattern.

Aspect 17. The method of any one of aspects 14 to 16, wherein the binary linear block coding scheme comprises a low-density parity-check coding scheme.

Aspect 18. The method of any one of aspects 14 to 17, further comprising:
selecting, from a plurality of base graphs, a base graph to be used in the low-density parity-check coding scheme; and
wherein the puncturing pattern is selected based on the base graph.

Aspect 19. The method of any one of aspects 14 to 18, wherein the puncturing pattern is selected based on at least one of a length of the sequence of decoded bits, a coding rate associated with the sequence of decoded bits, or a combination thereof.

Aspect 20. The method of any one of aspects 14 to 19, wherein the puncturing pattern is selected based on at least one of a data rate associated with the sequence of decoded bits, a latency requirement associated with the sequence of decoded bits, an error rate requirement associated with the sequence of decoded bits, or any combination thereof.

Aspect 21. The method of any one of aspects 14 to 20, wherein the puncturing pattern is selected by the first wireless node based on a type of receiver used by the second wireless node.

Aspect 22. The method of any one of aspects 14 to 21, further comprising:
determining an indication of a type of receiver used by the second wireless node; and
transmitting, to the first wireless node, the indication to enable the first wireless node to select the puncturing pattern based on the indication.

Aspect 23. The method of any one of aspects 14 to 22, wherein the puncturing pattern is selected based on a maximum number of decoding iterations which the second wireless node performs for decoding in accordance with the low-density parity-check coding scheme.

Aspect 24. The method of any one of aspects 14 to 23, further comprising:
determining an indication of a maximum number of decoding iterations which the second wireless node performs for decoding in accordance with the low-density parity-check coding scheme; and
transmitting, to the first wireless node, the indication to enable the first wireless node to select the puncturing pattern based on the indication.

Aspect 25. The method of any one of aspects 14 to 24, further comprising:

receiving, from the first wireless node, an indication of the selected puncturing pattern;
wherein the puncturing pattern is selected based on the indication of the puncturing pattern.

Aspect 26. The method of any one of aspects 14 to 25, wherein the indication of the selected puncturing pattern is received using at least one of radio resource control (RRC) signaling, medium access control (MAC) layer signaling, physical (PHY) layer signaling, or any combination thereof.

Aspect 27. The method of any one of aspects 14 to 26, wherein the plurality of puncturing patterns comprises a first puncturing pattern specifying to puncture all bits corresponding to only two variable nodes and a second puncturing pattern specifying to puncture all one or more bits corresponding to only one variable node.

Aspect 28. The method of any one of aspects 14 to 27, wherein generating the sequence of metrics comprises generating the second subset of metrics based on the plurality of symbols using a modulation scheme.

Aspect 29. An apparatus for wireless communication, the apparatus comprising:
a memory; and
one or more processors coupled to the memory, the memory and the one or more processors being configured to:
obtain a sequence of bits to be encoded;
select a puncturing pattern from a plurality of puncturing patterns;
generate, based on the sequence of bits to be encoded, a sequence of parity bits in accordance with a binary linear block coding scheme;
puncture, based on the selected puncturing pattern, at least one of the sequence of bits to be encoded or the sequence of parity bits;
generate a plurality of modulation symbols based on remaining bits in the sequence of bits to be encoded and based on remaining bits in the sequence of parity bits; and
transmit, to a second wireless node, the plurality of modulation symbols.

Aspect 30. An apparatus for wireless communication, the apparatus comprising:
a memory; and
one or more processors coupled to the memory, the memory and the one or more processors being configured to:
receive, from a first node, a plurality of modulation symbols corresponding to a sequence of bits to be decoded;
select a puncturing pattern from a plurality of puncturing patterns;
generate a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols;
generate, based on the sequence of metrics, a sequence of decoded bits in accordance with a binary linear block coding scheme; and
output the sequence of decoded bits for further processing.

Aspect 31. An apparatus for wireless communication (e.g., the apparatus configured for use at a first wireless node), the apparatus comprising: means for obtaining a sequence of bits to be encoded;
means for selecting a puncturing pattern from a plurality of puncturing patterns;
means for generating, based on the sequence of bits to be encoded, a sequence of parity bits in accordance with a binary linear block coding scheme;
means for puncturing, based on the selected puncturing pattern, at least one of the sequence of bits to be encoded or the sequence of parity bits;
means for generating a plurality of modulation symbols based on remaining bits in the sequence of bits to be encoded and based on remaining bits in the sequence of parity bits; and
means for transmitting, to a second wireless node, the plurality of modulation symbols.

Aspect 32. The apparatus for wireless communication according to aspect 31, further comprising means for carrying out the method of any of aspects 2 to 13.

Aspect 33. An apparatus for wireless communication (e.g., the apparatus configured for use at a second wireless node), the apparatus comprising:
means for receiving, from a first node, a plurality of modulation symbols corresponding to a sequence of bits to be decoded;
means for selecting a puncturing pattern from a plurality of puncturing patterns;
means for generating a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols;
means for generating, based on the sequence of metrics, a sequence of decoded bits in accordance with a binary linear block coding scheme; and
means for outputting the sequence of decoded bits for further processing.

Aspect 34. The apparatus for wireless communication according to aspect 33, further comprising means for carrying out the method of any of aspects 15 to 28.

Aspect 35. A non-transitory computer-readable medium storing one or more instructions for wireless communication, the one or more instructions, when executed by one or more processors, cause the one or more processors to:
obtain a sequence of bits to be encoded;
select a puncturing pattern from a plurality of puncturing patterns;
generate, based on the sequence of bits to be encoded, a sequence of parity bits in accordance with a binary linear block coding scheme;
puncture, based on the selected puncturing pattern, at least one of the sequence of bits to be encoded or the sequence of parity bits;
generate a plurality of modulation symbols based on remaining bits in the sequence of bits to be encoded and based on remaining bits in the sequence of parity bits; and
transmit, to a second wireless node, the plurality of modulation symbols.

Aspect 36. A non-transitory computer-readable medium storing one or more instructions for wireless communication, the one or more instructions, when executed by one or more processors, cause the one or more processors to:

receive, from a first node, a plurality of modulation symbols corresponding to a sequence of bits to be decoded;

select a puncturing pattern from a plurality of puncturing patterns;

generate a sequence of metrics, each metric corresponding to a bit and indicating a value of the bit and a reliability of the value of the bit, wherein the sequence of metrics comprises a first subset of metrics and a second subset of metrics, wherein the first subset of metrics is based on the selected puncturing pattern, and wherein the second subset of metrics is based on the plurality of modulation symbols;

generate, based on the sequence of metrics, a sequence of decoded bits in accordance with a binary linear block coding scheme; and output the sequence of decoded bits for further processing.

Aspect 37. A computer program comprising instructions which, when the program is executed by a computer, cause the computer to carry out the method of any of aspects 1 to 13 or 14 to 28.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, or a combination of hardware and software. As used herein, a processor is implemented in hardware, firmware, or a combination of hardware and software.

It will be apparent that systems and/or methods described herein may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various aspects. In fact, many of these features may be combined in ways not specifically recited in the claims and/or dis-closed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchange-ably with "one or more."

Where only one item is intended, the phrase "only one" or similar language is used. Also, as used herein, the terms "has," "have," "having," and/or the like are intended to be open-ended terms.

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

The invention claimed is:

1. A method for wireless communication by a first wireless node, the method comprising:

obtaining a sequence of bits to be encoded;

selecting a puncturing pattern from a plurality of puncturing patterns;

generating, based on the sequence of bits to be encoded, a sequence of parity bits in accordance with a binary linear block coding scheme;

puncturing, based on the selected puncturing pattern, at least one of the sequence of bits to be encoded or the sequence of parity bits;

generating a plurality of modulation symbols based on remaining bits in the sequence of bits to be encoded and based on remaining bits in the sequence of parity bits;

transmitting, to a second wireless node, the plurality of modulation symbols; and transmitting, to the second wireless node, an indication of the selected puncturing pattern.

2. The method of claim 1, wherein the binary linear block coding scheme comprises a low-density parity-check coding scheme.

3. The method of claim 2, further comprising:

selecting, from a plurality of base graphs, a base graph to be used in the low-density parity-check coding scheme, wherein the puncturing pattern is selected based on the base graph.

4. The method of claim 2, wherein the puncturing pattern is selected based on a maximum number of decoding iterations which the second wireless node is configured to perform for decoding in accordance with the low-density parity-check coding scheme.

5. The method of claim 2, further comprising:

determining an indication of a maximum number of decoding iterations which the second wireless node is configured to perform for decoding in accordance with the low-density parity-check coding scheme, wherein the puncturing pattern is selected based on the indication of the maximum number of decoding iterations.

6. The method of claim 1, wherein the indication of the selected puncturing pattern is transmitted using at least one of radio resource control (RRC) signaling, medium access control (MAC) layer signaling, physical (PHY) layer signaling, or any combination thereof.

7. The method of claim 1, wherein the plurality of puncturing patterns comprises a first puncturing pattern specifying to puncture all bits corresponding to only two variable nodes and a second puncturing pattern specifying to puncture all one or more bits corresponding to only one variable node.

8. The method of claim 1, wherein generating the plurality of modulation symbols further comprises generating the plurality of modulation symbols based on the remaining bits in the sequence of bits to be encoded and based on the remaining bits in the sequence of parity bits using a modulation scheme.

9. The method of claim 1, wherein the puncturing pattern is selected based on at least one of a length of the sequence of bits to be encoded, a coding rate associated with the sequence of bits to be encoded, or a combination thereof.

10. The method of claim 1, wherein the puncturing pattern is selected based on at least one of a data rate associated with the sequence of bits to be encoded, a latency requirement associated with the sequence of bits to be encoded, an error rate requirement associated with the sequence of bits to be encoded, or any combination thereof.

11. The method of claim 1, wherein the puncturing pattern is selected based on a type of receiver used by the second wireless node.

12. The method of claim 1, further comprising:
determining an indication of a type of receiver used by the second wireless node, wherein the puncturing pattern is selected based on the indication of the type of receiver.

13. A first wireless node for wireless communication, comprising:
a memory; and
one or more processors coupled with the memory and configured to cause the first wireless node to:
obtain a sequence of bits to be encoded;
select a puncturing pattern from a plurality of puncturing patterns;
generate, based on the sequence of bits to be encoded, a sequence of parity bits in accordance with a binary linear block coding scheme;
puncture, based on the selected puncturing pattern, at least one of the sequence of bits to be encoded or the sequence of parity bits;
generate a plurality of modulation symbols based on remaining bits in the sequence of bits to be encoded and based on remaining bits in the sequence of parity bits;
transmit, to a second wireless node, the plurality of modulation symbols; and
transmit, to the second wireless node, an indication of the selected puncturing pattern.

14. The first wireless node of claim 13, wherein the binary linear block coding scheme comprises a low-density parity-check coding scheme.

15. The first wireless node of claim 14, wherein the one or more processors are further configured to cause the first wireless node to:
select, from a plurality of base graphs, a base graph to be used in the low-density parity-check coding scheme, wherein the puncturing pattern is selected based on the base graph.

16. The first wireless node of claim 14, wherein the puncturing pattern is selected based on a maximum number of decoding iterations which the second wireless node is configured to perform for decoding in accordance with the low-density parity-check coding scheme.

17. The first wireless node of claim 14, wherein the one or more processors are further configured to cause the first wireless node to:
determine an indication of a maximum number of decoding iterations which the second wireless node is configured to perform for decoding in accordance with the low-density parity-check coding scheme, wherein the puncturing pattern is selected based on the indication of the maximum number of decoding iterations.

18. The first wireless node of claim 13, wherein the puncturing pattern is selected based on at least one of a length of the sequence of bits to be encoded, a coding rate associated with the sequence of bits to be encoded, or a combination thereof.

19. The first wireless node of claim 13, wherein the puncturing pattern is selected based on at least one of a data rate associated with the sequence of bits to be encoded, a latency requirement associated with the sequence of bits to be encoded, an error rate requirement associated with the sequence of bits to be encoded, or any combination thereof.

20. The first wireless node of claim 13, wherein the puncturing pattern is selected based on a type of receiver used by the second wireless node.

21. The first wireless node of claim 13, wherein the one or more processors are further configured to cause the first wireless node to:
determine an indication of a type of receiver used by the second wireless node, wherein the puncturing pattern is selected based on the indication of the type of receiver.

22. The first wireless node of claim 13, wherein the indication of the selected puncturing pattern is transmitted using at least one of radio resource control (RRC) signaling, medium access control (MAC) layer signaling, physical (PHY) layer signaling, or any combination thereof.

23. The first wireless node of claim 13, wherein the plurality of puncturing patterns comprises a first puncturing pattern specifying to puncture all bits corresponding to only two variable nodes and a second puncturing pattern specifying to puncture all one or more bits corresponding to only one variable node.

24. The first wireless node of claim 13, wherein generating the plurality of modulation symbols further comprises generating the plurality of modulation symbols based on the remaining bits in the sequence of bits to be encoded and based on the remaining bits in the sequence of parity bits using a modulation scheme.

25. A first wireless node for wireless communication, comprising:
means for obtaining a sequence of bits to be encoded;
means for selecting a puncturing pattern from a plurality of puncturing patterns;
means for generating, based on the sequence of bits to be encoded, a sequence of parity bits in accordance with a binary linear block coding scheme;
means for puncturing, based on the selected puncturing pattern, at least one of the sequence of bits to be encoded or the sequence of parity bits;
means for generating a plurality of modulation symbols based on remaining bits in the sequence of bits to be encoded and based on remaining bits in the sequence of parity bits;
means for transmitting, to a second wireless node, the plurality of modulation symbols; and
means for transmitting, to the second wireless node, an indication of the selected puncturing pattern.

26. A non-transitory computer-readable medium storing code for wireless communication, the code comprising instructions executable by one or more processors to:
obtain a sequence of bits to be encoded;
select a puncturing pattern from a plurality of puncturing patterns;
generate, based on the sequence of bits to be encoded, a sequence of parity bits in accordance with a binary linear block coding scheme;
puncture, based on the selected puncturing pattern, at least one of the sequence of bits to be encoded or the sequence of parity bits;
generate a plurality of modulation symbols based on remaining bits in the sequence of bits to be encoded and based on remaining bits in the sequence of parity bits;

transmit, to a second wireless node, the plurality of modulation symbols; and transmit, to the second wireless node, an indication of the selected puncturing pattern.

\* \* \* \* \*